US010567042B2

(12) United States Patent
Ahn et al.

(10) Patent No.: US 10,567,042 B2
(45) Date of Patent: Feb. 18, 2020

(54) COIL MODULE

(71) Applicant: WITS Co.. Ltd., Yongin-si, Gyeonggi-do (KR)

(72) Inventors: Dae Ung Ahn, Suwon-si (KR); Si Hyung Kim, Suwon-si (KR); Hyeon Gil Nam, Suwon-si (KR); Ki Won Chang, Suwon-si (KR); Yu Jin Lee, Suwon-si (KR); Dae Ki Lim, Suwon-si (KR)

(73) Assignee: WITS Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/806,703

(22) Filed: Nov. 8, 2017

(65) Prior Publication Data
US 2018/0159598 A1 Jun. 7, 2018

(30) Foreign Application Priority Data

Dec. 1, 2016 (KR) .................. 10-2016-0162721
Jun. 28, 2017 (KR) .................. 10-2017-0081850
Aug. 22, 2017 (KR) .................. 10-2017-0105862

(51) Int. Cl.
*H04B 5/00* (2006.01)
*H05K 1/02* (2006.01)
*H01F 5/00* (2006.01)

(52) U.S. Cl.
CPC ........... *H04B 5/0081* (2013.01); *H01F 5/003* (2013.01); *H04B 5/0037* (2013.01); *H05K 1/0216* (2013.01)

(58) Field of Classification Search
CPC ..... H04B 5/0081; H04B 5/0037; H01F 5/003; H05K 1/0216

(Continued)

(56) References Cited

U.S. PATENT DOCUMENTS 9,037,201 B2 * 5/2015 Holz .................. G08C 17/02
455/575.9
2011/0250838 A1 * 10/2011 Alexopoulos .......... H01Q 19/10
455/41.1

(Continued)

FOREIGN PATENT DOCUMENTS

CN 104577342 A 4/2015
CN 104734271 A 6/2015

(Continued)

OTHER PUBLICATIONS

Korean Office Action dated Aug. 20, 2018 in corresponding Korean Patent Application No. 10-2017-0081850 (5 pages in English and 5 pages in Korean).

(Continued)

*Primary Examiner* — April G Gonzales
(74) *Attorney, Agent, or Firm* — Harness, Dickey & Pierce, P.L.C.

(57) ABSTRACT

A coil module may include: a board; an input/output terminal unit formed on the board; and a coil for near field communications (NFC) disposed on one, or a plurality of, surface(s) of the board and connected to the input/output terminal unit, wherein the coil for NFC includes a first pattern portion having one end connected to the input/output terminal unit and disposed on the board to rotate or turn in one direction, a second pattern portion connected to the first pattern portion and traversing an internal area of the first pattern portion to divide the internal area of the first pattern portion into at least two portions, and a third pattern portion having one end connected to the second pattern portion and the other end connected to the input/output terminal unit.

25 Claims, 25 Drawing Sheets

(58) Field of Classification Search
USPC .......................................................... 455/41.1
See application file for complete search history.

(56) References Cited

U.S. PATENT DOCUMENTS

| | | | | |
|---|---|---|---|---|
| 2013/0038136 A1* | 2/2013 | Wheatley | ............. | G06K 7/0008 307/104 |
| 2013/0169062 A1* | 7/2013 | Maikawa | ................ | H02J 50/10 307/104 |
| 2013/0181876 A1* | 7/2013 | Miura | ................ | G06K 7/10316 343/788 |
| 2013/0252661 A1* | 9/2013 | Holz | ....................... | G08C 17/02 455/552.1 |
| 2013/0260677 A1* | 10/2013 | Partovi | .................... | H01F 5/003 455/41.1 |
| 2013/0267170 A1* | 10/2013 | Chong | ................ | H04B 1/3833 455/41.1 |
| 2013/0307469 A1* | 11/2013 | Kuroda | ................ | H04B 5/0037 320/108 |
| 2014/0011447 A1* | 1/2014 | Konanur | .................. | H04B 5/00 455/41.1 |
| 2014/0154980 A1* | 6/2014 | Jang | ..................... | H04B 5/0025 455/41.1 |
| 2014/0168026 A1* | 6/2014 | Nakamura | ................ | H01F 5/04 343/788 |
| 2014/0210406 A1* | 7/2014 | Na | ........................ | H02J 5/005 320/108 |
| 2015/0061400 A1* | 3/2015 | Park | ....................... | H01F 38/14 307/104 |
| 2015/0076919 A1* | 3/2015 | Park | ....................... | H02J 5/005 307/104 |
| 2015/0263792 A1* | 9/2015 | Saitou | ..................... | H01Q 7/00 307/104 |
| 2015/0381239 A1* | 12/2015 | Shostak | ............... | H04B 5/0037 455/41.1 |
| 2016/0137072 A1* | 5/2016 | Lee | ....................... | B60L 11/182 320/108 |
| 2016/0210615 A1* | 7/2016 | Lee | .................... | G06Q 20/3278 |
| 2016/0210616 A1* | 7/2016 | Lee | .................... | G06Q 20/3278 |
| 2017/0005519 A1* | 1/2017 | Lee | ....................... | H02J 50/10 |
| 2017/0047636 A1* | 2/2017 | Lee | ..................... | H04B 5/0031 |

FOREIGN PATENT DOCUMENTS

| | | |
|---|---|---|
| CN | 105809428 A | 7/2016 |
| CN | 207994064 U | 10/2018 |
| KR | 10-2014-0021127 A | 2/2014 |
| KR | 10-1467706 B1 | 12/2014 |
| KR | 10-1554133 B1 | 9/2015 |
| KR | 10-1574322 B1 | 12/2015 |
| KR | 10-2016-0090235 A | 7/2016 |
| KR | 10-2016-0135677 A | 11/2016 |

OTHER PUBLICATIONS

Chinese Office Action dated Oct. 8, 2019 issued in corresponding Chinese Application No. 201711247834.2.

* cited by examiner

COIL MODULE

CROSS-REFERENCE TO RELATED APPLICATION(S)

This application claims benefit of priority under 35 USC § 119(a) to Korean Patent Application Nos. 10-2016-0162721 filed on Dec. 1, 2016, 10-2017-0081850 filed on Jun. 28, 2017 and 10-2017-0105862 filed on Aug. 22, 2017 in the Korean Intellectual Property Office, the disclosures of each of which are incorporated herein by reference in their entirety.

BACKGROUND

1. Field

In an embodiment, the description relates to a coil module.

2. Description of Related Art

Recently, in accordance with the growth of the mobile phone market, the adoption of wireless charging functions have increased. Further, when considering various products in which wireless charging functions are adopted, such as a desk, a table, and the like, in which wireless charging is possible, it is expected that the wireless charger market will further increase.

Meanwhile, recently, several standards, such as a near field communications (NFC) standard, a magnetic secure transmission (MST) standard, a wireless power consortium (WPC) standard function, and the like, have been used in a reception portion for implementing a wireless charging function, and a decrease in thickness of the reception portion has been structurally necessary in accordance with a decrease in thickness of mobile phones.

In addition, NFC patterns according to the related art have been formed in a simple quadrangular or circular shape in order to significantly increase card mode performance. However, while patterns occupying a wide area contribute to improvements in card mode performance, such patterns may have a problem in terms of recognizing NFC tags having various magnitudes.

Therefore, additional circular patterns connected to a central portion of the NFC patterns in series have been formed and used in order to improve recognition rate of NFC tags having various magnitudes. However, magnetic flux of a central coil and magnetic flux of an outer coil may offset each other in a space between the central coil and the outer coil, such that recognition rate of NFC tags may be significantly reduced.

SUMMARY

In an aspect, the description provides a coil module including a board, an input/output terminal unit formed on the board, and a coil for near field communications (NFC) formed on a surface of the board and connected to the input/output terminal unit, wherein the coil for NFC includes a first pattern portion having one end connected to the input/output terminal unit and disposed on the board turning in one direction, a second pattern portion connected to the first pattern portion and disposed to transverse an internal area of the first pattern portion to divide the internal area of the first pattern portion into two or more portions, and a third pattern portion having one end connected to the second pattern portion and the other end connected to the input/output terminal unit.

The coil module may include a semicircular pattern disposed in a central portion and having a semicircular shape.

The first pattern portion of the coil module may include a 1-1-th pattern portion connected to the input/output terminal unit and disposed on along an edge of the board and a 1-2-th pattern portion connected to the 1-1-th pattern portion and disposed inside the 1-1-th pattern portion.

The third pattern portion may be disposed on the board to be partially disposed inside the 1-2-th pattern portion.

The first pattern portion may be disposed to turn along an edge of the board, the second pattern portion may have a semicircular pattern formed in a central portion, and the third pattern portion may have one end portion connected to the second pattern portion inside the first pattern portion and the other end portion external of the first pattern portion and connected to the input/output terminal unit.

The second pattern portion may include an inclined pattern disposed to be inclined in relation to one side surface of the board. The inclined pattern may have a first inclined pattern and a second inclined pattern having a gradient with respect to the side surface of the board different from that of the first inclined pattern. The second inclined pattern may have a gradient of with a sign that is opposite to that of the gradient of the first inclined pattern.

The coil module may include a shielding sheet disposed on an upper surface of the board and a protective film disposed on the shielding sheet.

In another aspect, the coil module includes a flexible board, an input/output terminal unit extended from the flexible board, a coil for NFC formed disposed on a surface of the board and connected to the input/output terminal unit, and a coil for magnetic secure transmission (MST) formed on a surface of the board, wherein the coil for NFC includes a first pattern portion having one end connected to the input/output terminal unit and formed on the board to turn in one direction, a second pattern portion connected to the first pattern portion and disposed to transverse an internal area of the first pattern portion to divide the internal area of the first pattern portion into two, or more, portions, and a third pattern portion having one end connected to the second pattern portion and the other end connected to the input/output terminal unit, and the coil for MST includes a first coil for MST having a planar spiral shape and a second coil for MST disposed to be spaced apart from the first coil for MST and having a planar spiral shape, and one, or both, of the first coil for MST and the second coil for MST is disposed in an internal area formed by the first pattern portion.

In an area in which the coil for MST and the coil for NFC overlap each other, one of the coil for MST and or the coil for NFC is formed on an upper surface of the flexible board, and the other of the coil for MST or the coil for NFC is disposed to penetrate through the flexible board and is disposed on a lower surface of the flexible board.

The first pattern portion may be disposed to turn along an edge of the flexible board. The second pattern portion may be formed of a single strand of wire. The second pattern portion may be disposed to traverse the internal area of the first pattern portion in a transversal direction.

The second pattern portion may be disposed to traverse a central portion of the internal area of the first pattern portion. The third pattern portion may have one end portion connected to the second pattern portion inside the first pattern portion and the other end portion external of the first pattern portion and connected to the input/output terminal unit.

In another aspect, a coil module for NFC includes three areas, area S1, bounded by the first pattern portion and the second pattern portion on one side of the board, area S3, bounded by the first pattern portion and the second pattern portion on the other side of the board, and area S3, located in between areas S1 and S2, wherein magnetic flux generated by the coil for NFC in area S3 is greater than area S2 and area S1, and magnetic flux generated in area S2 is greater than S1. The second pattern may have a semicircular region in a central portion. The second pattern portion may include an inclined pattern disposed to be inclined in relation to one side surface of the board. The inclined pattern may have a first inclined pattern and a second inclined pattern having a gradient with respect to the side surface of the board different from that of the first inclined pattern.

BRIEF DESCRIPTION OF DRAWINGS

The above and other aspects, features, and advantages of the description will be more clearly understood from the following detailed description taken in conjunction with the accompanying drawings, in which.

DETAILED DESCRIPTION

Hereinafter, exemplary embodiments will be described in detail with reference to the accompanying drawings.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Figure 1:
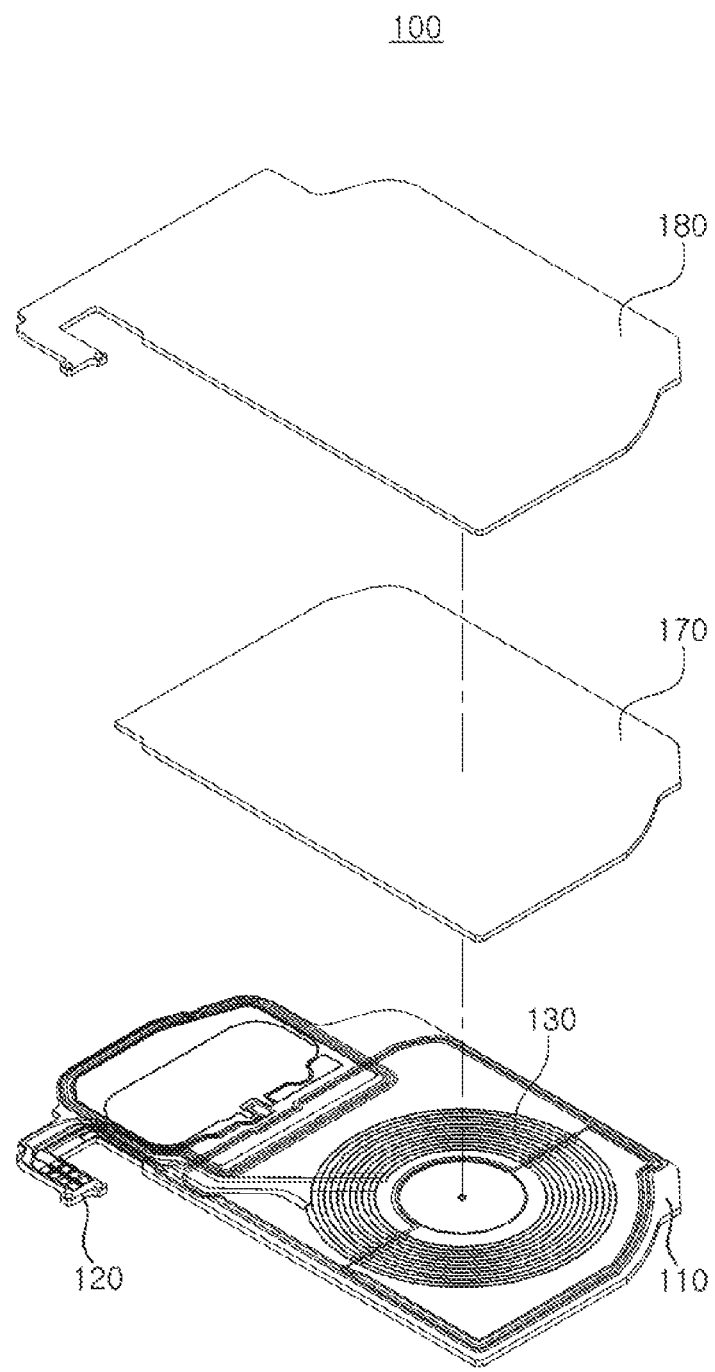
FIG. 1 is an exploded perspective view illustrating a coil module according to a first exemplary embodiment.
Figure 2:
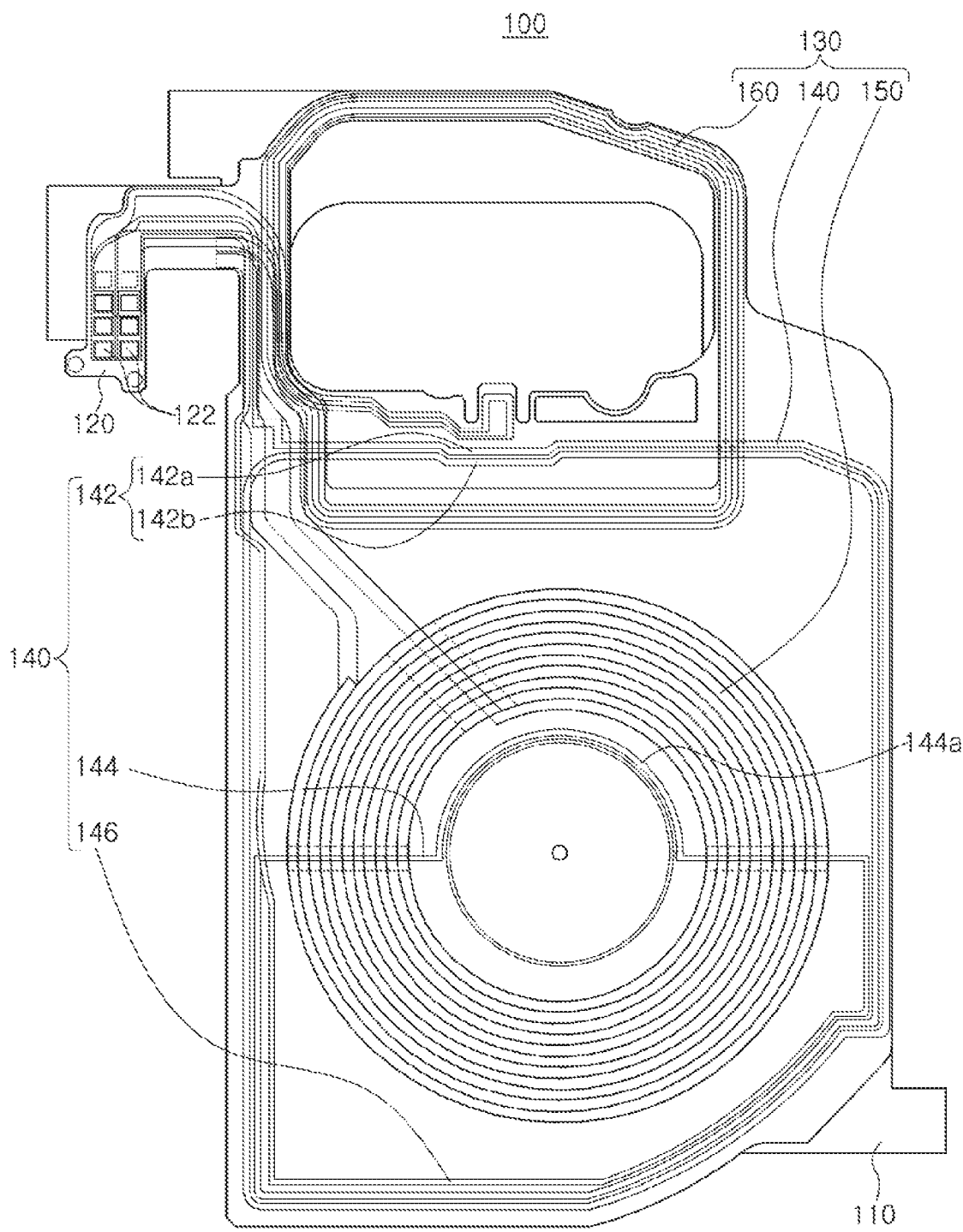
FIG. 2 is a plan view illustrating a coil portion of the coil module according to a first exemplary embodiment.
Figure 3:
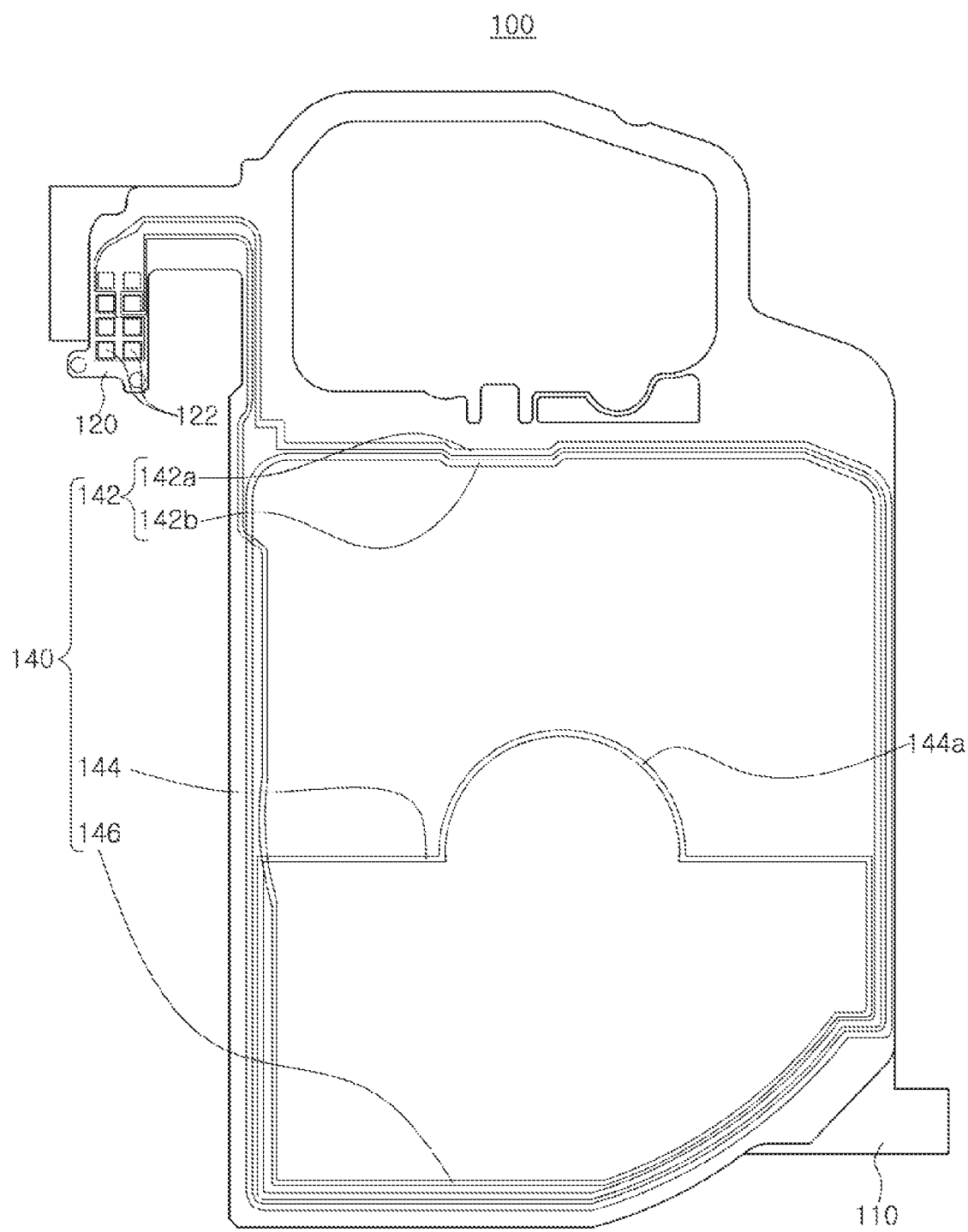
FIG. 3 is a plan view illustrating a coil for near field communications (NFC) included in the coil portion according to a first exemplary embodiment.

FIG. 1 is an exploded perspective view illustrating a coil module according to a first exemplary embodiment, FIG. 2 is a plan view illustrating a coil portion of the coil module according to a first exemplary embodiment, and FIG. 3 is a plan view illustrating a coil for near field communications (NFC) included in the coil portion according to a first exemplary embodiment.

Referring to FIGS. 1 through 3, a coil module 100 according to a first exemplary embodiment may include a board 110, an input/output terminal unit 120, a coil portion 130, a shielding sheet 170, and a protective film 180.

The board 110 may be formed of a hard material. In addition, the board 110, a base element on which the coil portion 130 is formed, may be formed of a material having heat resistance, pressure resistance, and having some flexibility. For example, the board 110 may be formed of a material (for example, FR-3, FR-4, or the like) containing an epoxy resin. That is, in one embodiment, the board 110 may be formed of several folds of paper in which an epoxy-resin adhesive is impregnated or be formed by stacking several glass fibers in which an epoxy resin is impregnated. Other embodiments of the board with such characteristics are known in the art and can also be used.

In addition, the board 110 may be a flexible circuit board as one example, and may be a double-sided board. That is, a plurality of coils may be disposed to penetrate through the board 110 and be disposed on a lower surface of the board 110 and may also be disposed to penetrate through the board 110 and be disposed on an upper surface of the board 110 in portions in which the plurality of coils overlap one another, so as not to directly overlap one another. Therefore, the plurality of coils may be disposed so as not to overlap one another.

However, the plurality of coils are not limited thereto. That is, the plurality of coils may be formed in two layers sequentially stacked on a base, and the plurality of coils may be disposed in a lower layer of the two layers sequentially stacked and also be disposed in an upper layer. Therefore, the plurality of coils may be disposed so as not to overlap one another and be disposed spaced apart from one another in one embodiment.

Meanwhile, the board 110 may be provided with the input/output terminal unit 120 connected to an external source to form an electrical connection. In addition, the input/output terminal unit 120 may protrude from one side surface of the board 110, and may have a bar shape.

In addition, the input/output terminal unit 120 may include eight connection terminals 122 as an example, and the coil portion 130 described above may be connected to the connection terminals 122. An embodiment in which the eight connection terminals 122 are formed in the input/output terminal unit 120 is described by way of example. However, the number of connection terminals 122 is not limited thereto, and may be varied.

The coil portion 130 may be formed on a surface of the board 110, and may be connected to the input/output terminal unit 120. As an example, the coil portion 130 may be formed of planar coils wound in a clockwise direction or in a counterclockwise direction and having a circular shape, an oval shape, or a polygonal shape.

The coil portion 130 may include a coil 140 for near field communications (NFC) disposed approximately along an edge of the board 110, a first coil 150 disposed in a central portion of the board 110, and a coil 160 for magnetic secure transmission (MST) disposed above the first coil 150.

Meanwhile, since the coil 140 for NFC uses a frequency band higher than that of the first coil 150, the coil 140 for NFC may be formed of conductive patterns having a fine line width, and the first coil 150 may serve as a coil for wireless power transfer (WPT) when it needs to transmit power and serve as a coil for MST when it needs to wirelessly transmit magnetic information. Meanwhile, since the first coil 150 uses a frequency band lower than that of the coil 140 for NFC, the first coil 150 may be formed of conductive patterns having a line width greater than that of the coil 140 for NFC inside the coil 140 for NFC.

In addition, the coil 160 for MST may be formed of conductive patterns having the same line width as that of the conductive patterns of the first coil 150 as an example. However, the coil 160 for MST is not limited thereto, but may also be formed of conductive patterns having a line width smaller or greater than that of the conductive patterns of the first coil 150.

Meanwhile, a case in which the first coil 150 performs multiple functions is described by way of example in an embodiment. However, the first coil 150 is not limited thereto, and may be formed of a coil for WPT performing a power transmission function.

As illustrated in more detail in FIG. 3, the coil 140 for NFC may include a first pattern portion 142 connected to the input/output terminal unit 120 and having one, or a plurality of, turn(s) in one direction along the edge of the board 110 to form an internal area, a second pattern portion 144 connected to the first pattern portion 142 and traversing the internal area of the first pattern portion 142 to divide the internal area of the first pattern portion 142 into at least two portions, and a third pattern portion 146 having one end connected to the second pattern portion 144 and the other end connected to the input/output terminal unit 120.

Meanwhile, an example in which the first pattern portion 142 rotates in one direction along the edge of the board 110 is described above. However, the first pattern portion 142 is not limited thereto, but may also be formed on a substantially central portion of the board 110.

The first pattern portion 142 may include a 1-1-th pattern portion 142a having one end connected to the connection terminals 122 of the input/output terminal unit 120 and disposed to rotate or turn in one direction along the edge of the board 110 and a 1-2-th pattern portion 142b connected to the 1-1-th pattern portion 142a and disposed inside the 1-1-th pattern portion 142a.

Meanwhile, the second pattern portion 144 may traverse the internal area of the first pattern portion 142 to divide the internal area of the first pattern portion 142 into two, or more, portions in a transversal direction, and may have one end connected to the 1-2-th pattern portion 142b and the other end connected to the third pattern portion 146 described above. Meanwhile, the second pattern portion 144 may include a semicircular pattern 144a formed in a central portion thereof having a semicircular shape.

In addition, the third pattern portion 146 may have one end connected to the second pattern portion 144 described above and the other end connected to the connection terminals 122 of the input/output terminal unit 120. In addition, the third pattern portion 146 may be disposed to rotate or turn in one direction inside the 1-2-th pattern portion 142b and then extend toward the input/output terminal unit 120.

The shielding sheet 170 may serve to shield a magnetic field generated in the coil portion 130. To this end, the shielding sheet 170 may have a size sufficient to cover the coil portion 130. Meanwhile, the shielding sheet 170 may include a magnetic sheet (not illustrated) and an adhesive layer (not illustrated). The magnetic sheet may include two or more thin plates. As an example, a magnetic material contained in the magnetic sheet may be used to form a magnetic path for the magnetic field generated by the coil portion 130, and may be provided in order to efficiently form the magnetic path of the magnetic field. To this end, the magnetic material may be a material in which the magnetic path may be easily formed, for example, a material having high magnetic permeability, such as ferrite, a nanocrystal magnetic material, an amorphous magnetic material, a silicon steel sheet, or the like.

The adhesive layer may be formed on a surface of the magnetic sheet, may be formed of an adhesive material that is known in the art, for example, a known resin composition, and may be formed of a material, or the like, physically coupling the magnetic sheets to each other or forming a chemical bond to a magnetic layer of the magnetic sheet.

The protective film 180 may be disposed on the shielding sheet 170, and may serve to prevent damage to the shielding sheet 170 and the coil portion 130. As an example, an adhesive layer (not illustrated) may also be formed on a lower surface of the protective film 180.

As described above, an offset magnetic flux may be reduced and a wider recognition range may be obtained, through the coil 140 for NFC having the first to third pattern portions 142, 144, and 146.

An operation of the coil module according to a first exemplary embodiment will hereinafter be described with reference to the drawings.

Figure 4:
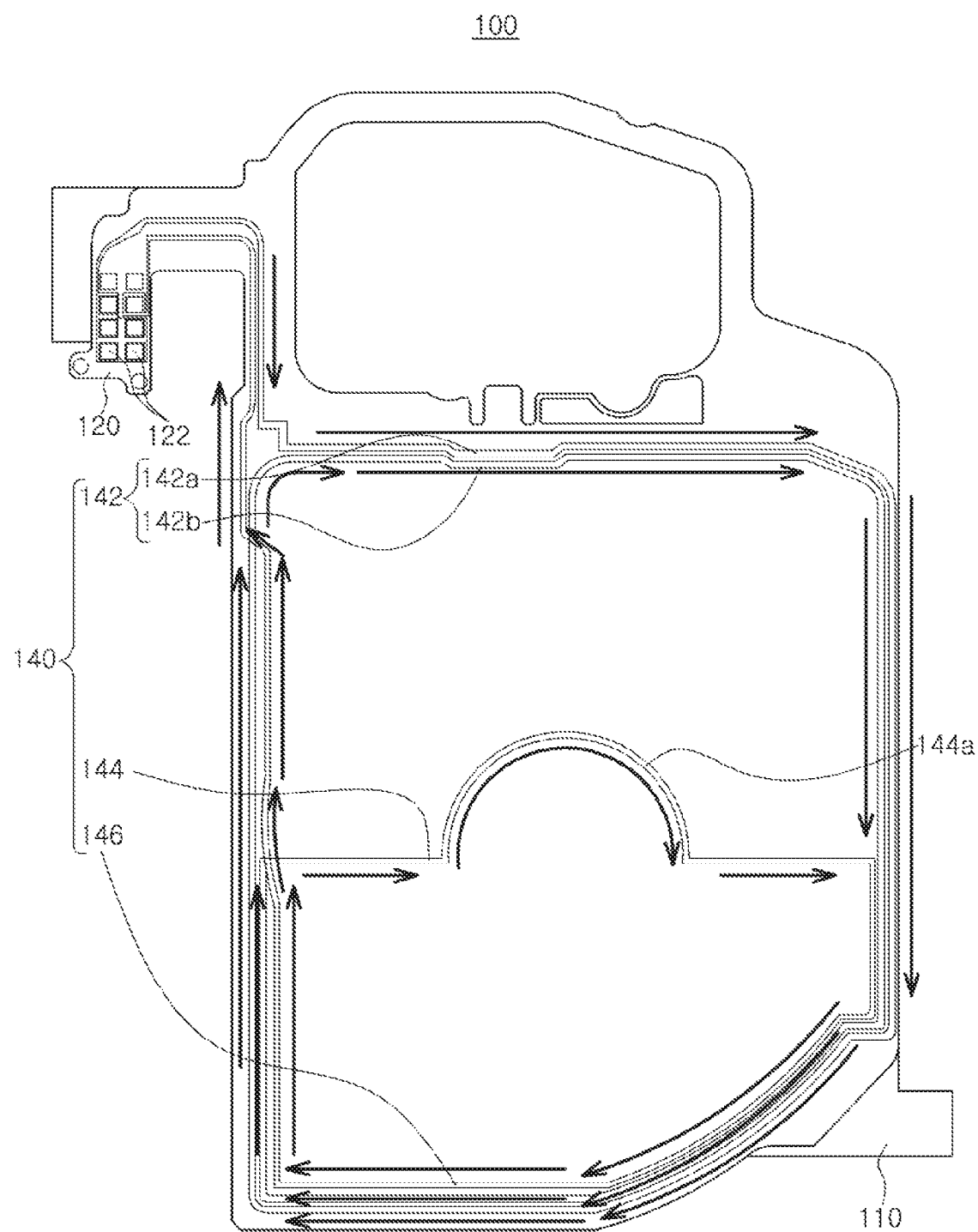
FIG. 4 is a view illustrating an operation of the coil for NFC included in the coil portion according to a first exemplary embodiment.
Figure 5:
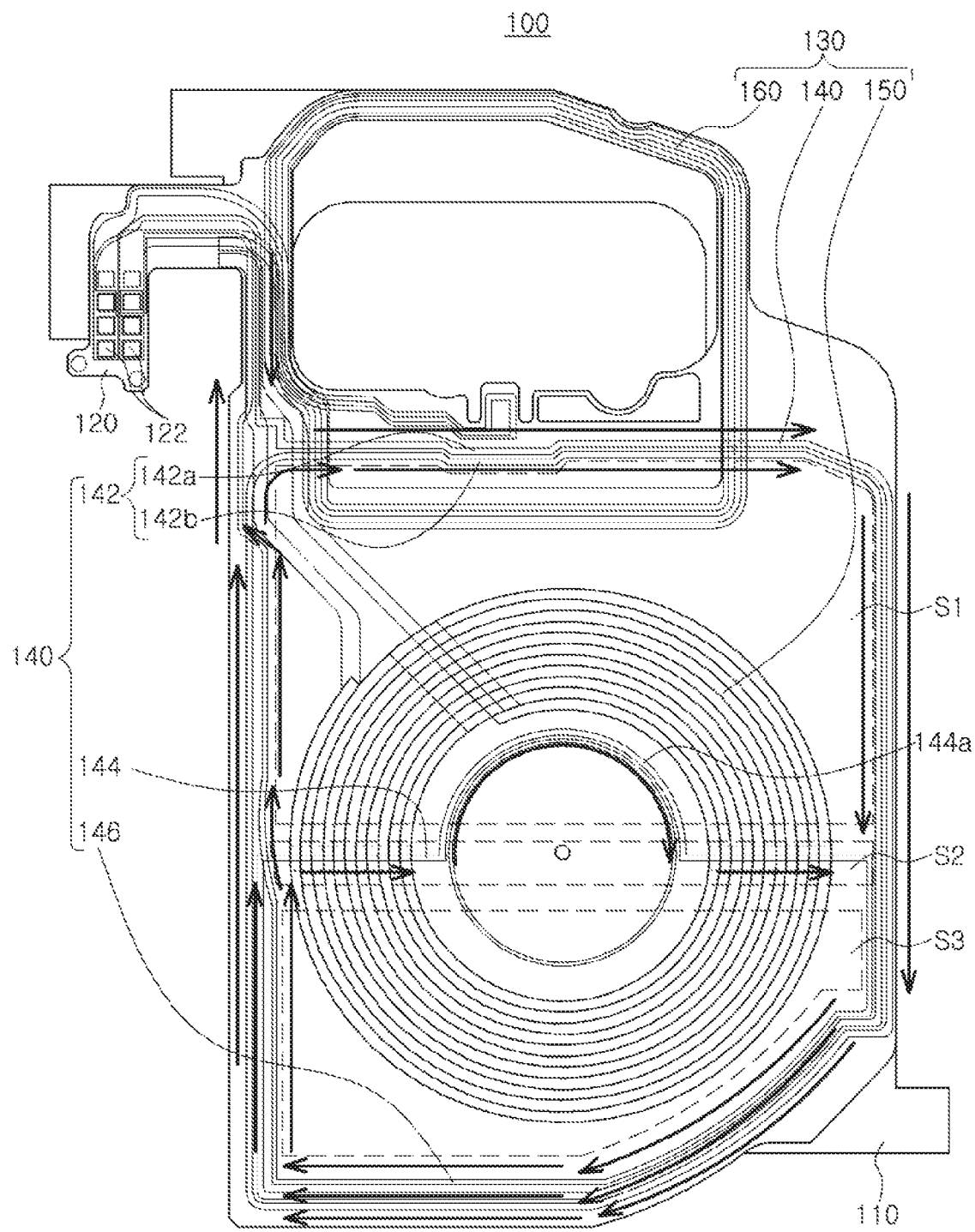
FIG. 5 is a view illustrating intensity of magnetic flux in the coil for NFC included in the coil module according to a first exemplary embodiment.

FIG. 4 is a view illustrating an operation of the coil for NFC included in the coil portion according to a first exemplary embodiment, and FIG. 5 is a view illustrating intensity of magnetic flux in the coil for NFC included in the coil module according to a first exemplary embodiment.

Referring to FIG. 4, when a current flows through the coil 140 for NFC, the current may flow in the order of the first pattern portion 142, the second pattern portion 144, and the third pattern portion 146 of the coil 140 for NFC. That is, when current flows from the connection terminals 122 of the input/output terminal unit 120 to the coil 140 for NFC, the current may flow in a clockwise direction along the 1-1-th pattern portion 142a of the first pattern portion 142, and then flow along the 1-2-th pattern portion 142b.

Then, the current may flow along the second pattern portion 144 connected to the 1-2-th pattern portion 142b. Here, the second pattern portion 144 is disposed to traverse the internal area of the first pattern portion 142 to divide the internal area of the first pattern portion 142 into two, or more, portions, and the current may thus flow to traverse the internal area of the first pattern portion 142.

Then, the current may flow in a clockwise direction along the third pattern portion 146 connected to the second pattern portion 144, and may finally flow to the connection terminals 122 of the input/output terminal unit 120.

In addition, as illustrated in FIG. 5, intensities of magnetic flux of an area S1 disposed on an upper end portion of the board 110, formed by the first pattern portion 142 and the second pattern portion 144, an area S2 disposed between the area S1 disposed on the upper end portion of the board 110 and an area S3 disposed on a lower end portion of the board 110, and the area S3 disposed on the lower end portion of the board 110 formed by the first pattern portion 142 and the second pattern portion 144 may be large in a sequence of: the area S3 disposed on the lower end portion of the board 110 formed by the first pattern portion 142 and the second pattern portion 144, the area S2 disposed between the area S1 disposed on the upper end portion of the board 110 and the area S3 disposed on the lower end portion of the board 110, and the area S1 disposed on the upper end portion of the board 110 formed by the first pattern portion 142 and the second pattern portion 144.

That is, peak point indications of various tags may be more widely distributed as compared to the related art through the area S3 disposed on the lower end portion of the board 110 formed by the first pattern portion 142 and the second pattern portion 144, in other words, a pattern shape having a size corresponding to a card size.

Further, the third pattern portion 146 may be formed to reduce offset magnetic flux in the area S1 disposed on the upper end portion of the board 110 formed by the first pattern portion 142 and the second pattern portion 144.

Further, magnetic flux having a sufficient intensity in the area S2 disposed between the area S1, that is needed to ensure performance and is disposed on the upper end portion of the board 110, and the area S3 disposed on the lower end portion of the board 110 may be obtained through the second pattern portion 144.

In addition, the semicircular pattern 144a is formed in the central portion of the second pattern portion 144, and performance deterioration due to offset magnetic flux generated in the surrounding portion of the semicircular pattern 144a may be reduced. In other words, the second pattern portion 144 does not have a spiral shape, but may include a semicircular pattern 144a wherein one side is open, such that offset magnetic flux in the open portion may be reduced to reduce performance deterioration.

Hereinafter, modified examples of the coil module will be described with reference to the drawings. However, the same components as the abovementioned components will be denoted by the same reference numerals, and a detailed description therefor will be omitted. Further, illustration and a detailed description of the shielding sheet and the protective film included in the coil module according to an embodiment will be omitted based on the above description.

Figure 6:
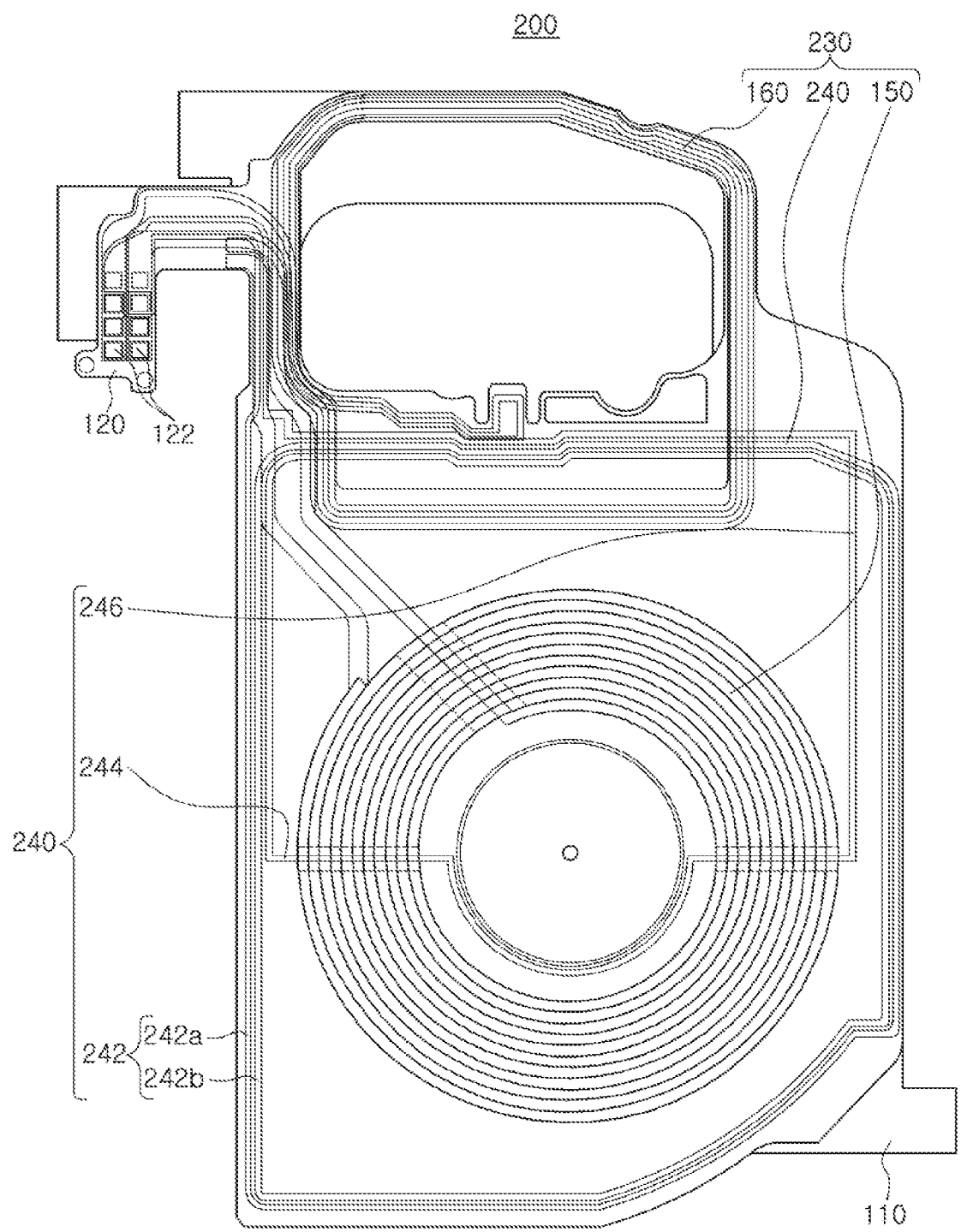
FIG. 6 is a plan view illustrating a coil module according to a second exemplary embodiment.
Figure 7:
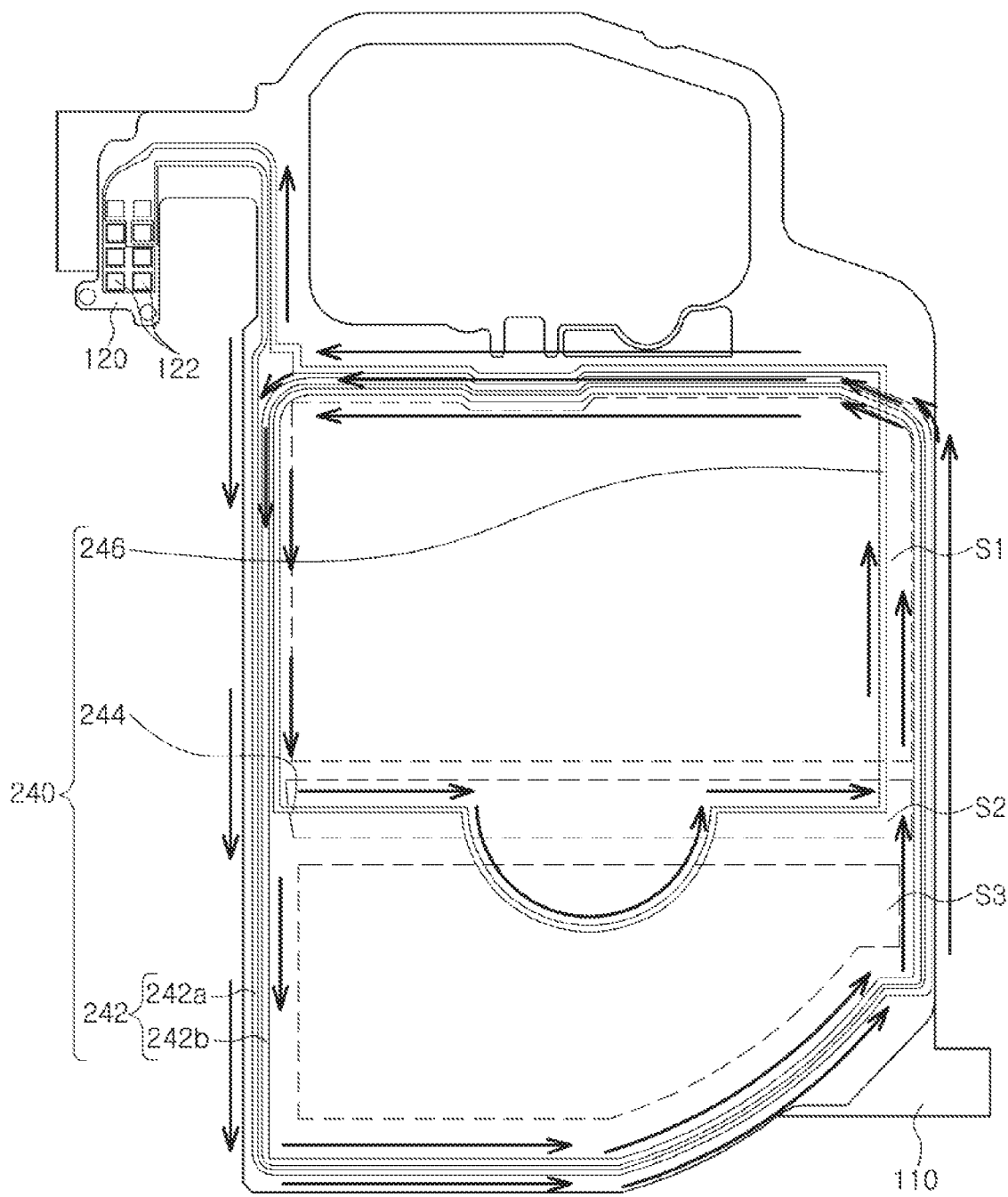
FIG. 7 is a plan view illustrating a coil for NFC included in the coil module according to a second exemplary embodiment.

FIG. 6 is a plan view illustrating a coil module according to a second exemplary embodiment, and FIG. 7 is a plan view illustrating a coil for NFC included in the coil module according to a second exemplary embodiment.

Referring to FIGS. 6 and 7, a coil module 200 according to a second exemplary embodiment may include a board 110, an input/output terminal unit 120, and a coil portion 230 by way of example.

Meanwhile, the board 110 and the input/output terminal unit 120 are the same as described above, and a detailed description will thus be omitted. In addition, components except for a coil 240 for NFC of the coil portion 230 are the same as described above, and a detailed description therefor will thus be omitted.

That is, only the coil 240 for NFC of the coil portion 230 will hereinafter be described.

The coil 240 for NFC may include a first pattern portion 242 connected to the input/output terminal unit 120 and rotating or turning in the other direction (the counterclockwise direction) along an edge of the board 110, a second pattern portion 244 connected to the first pattern portion 242 and traversing an internal area of the first pattern portion 242 to divide the internal area of the first pattern portion 242 into two, or more, portions, and a third pattern portion 246 having one end connected to the second pattern portion 244 and the other end connected to the input/output terminal unit 120.

The first pattern portion 242 may include a 1-1-th pattern portion 242a having one end connected to the connection terminals 122 of the input/output terminal unit 120 and having a spiral shape rotating or turning in the other direction (the counterclockwise direction) along the edge of the board 110 and a 1-2-th pattern portion 242b connected to the 1-1-th pattern portion 242a and disposed inside the 1-1-th pattern portion 242a.

Meanwhile, the second pattern portion 244 may be disposed to traverse the internal area of the first pattern portion 242 to divide the internal area of the first pattern portion 242 into at least two portions in the transversal direction, and may have one end connected to the 1-2-th pattern portion 242b and the other end connected to the third pattern portion 246 described above. Meanwhile, the second pattern portion 244 may include a semicircular pattern 244a formed in a central portion thereof and having a semicircular shape.

In addition, the third pattern portion 246 may have one end connected to the second pattern portion 244 described above in the internal area of the first pattern portion 242 and the other end connected to the connection terminals 122 of the input/output terminal unit 120. In addition, the third pattern portion 246 may be external from an inner portion of the first pattern portion 242, be disposed to rotate in the other direction outside the 1-1-th pattern portion 242a, and then extend toward the input/output terminal unit 120.

Meanwhile, as illustrated in more detail in FIG. 7, when a current flows through the coil 240 for NFC, the current may flow in the order of the first pattern portion 242, the second pattern portion 244, and the third pattern portion 246 of the coil 240 for NFC. That is, when the current flows from the connection terminals 122 of the input/output terminal unit 120 to the coil 240 for NFC, the current may flow in the counterclockwise direction along the 1-1-th pattern portion 242a of the first pattern portion 242, and then flow along the 1-2-th pattern portion 242b.

Then, the current may flow along the second pattern portion 244 connected to the 1-2-th pattern portion 242b. Here, the second pattern portion 244 is disposed to traverse the internal area of the first pattern portion 242, and the current may thus flow to traverse the internal area of the first pattern portion 242.

Then, the current may flow in the counterclockwise direction along the third pattern portion 246 connected to the second pattern portion 244, and may finally flow to the connection terminals 122 of the input/output terminal unit 120.

In addition, intensities of magnetic fluxes of an area S1 disposed on an upper end portion of the board 110 formed by the first pattern portion 242 and the second pattern portion 244, an area S2 disposed between the area S1 disposed on the upper end portion of the board 110 and an area S3 disposed on a lower end portion of the board 110, and the area S3 disposed on the lower end portion of the board 110 formed by the first pattern portion 242 and the second pattern portion 244 may be large in a sequence of: the area S3 disposed on the lower end portion of the board 110 formed by the first pattern portion 242 and the second pattern portion 244, the area S2 disposed between the area S1 disposed on the upper end portion of the board 110 and the area S3 disposed on the lower end portion of the board 110, and the area S1 disposed on the upper end portion of the board 110 formed by the first pattern portion 242 and the second pattern portion 244.

That is, peak point indications of various tags may be more widely distributed as compared to the related art through the area S3 disposed on the lower end portion of the board 110 among the areas formed by the first pattern portion 242 and the second pattern portion 244, in other words, a pattern shape having a size corresponding to a card size.

As described above, an area having the pattern shape having the size corresponding to the card size and in which the peak point indications of the various tags are formed may be varied into an area different from an area in the exemplary embodiment described above.

Further, the third pattern portion 246 may be formed to reduce an offset magnetic flux in the area S1 disposed on the upper end portion of the board 110 among the areas formed by the first pattern portion 242 and the second pattern portion 244.

Further, magnetic flux having a sufficient intensity in the area S2 disposed between the area S1 that is needed to ensure performance and is disposed on the upper end portion of the board 110 and the area S3 disposed on the lower end portion of the board 110 may be obtained through the second pattern portion 244.

In addition, the semicircular pattern 244a is formed in the central portion of the second pattern portion 244, and performance deterioration due to an offset magnetic flux generated in the surrounding portion of the semicircular pattern 244a may be reduced. In other words, the second pattern portion 244 does not have a spiral shape, but may include a semicircular pattern 244a of which one side is open, such that an offset magnetic flux in the open portion may be reduced to reduce performance deterioration.

Figure 8:
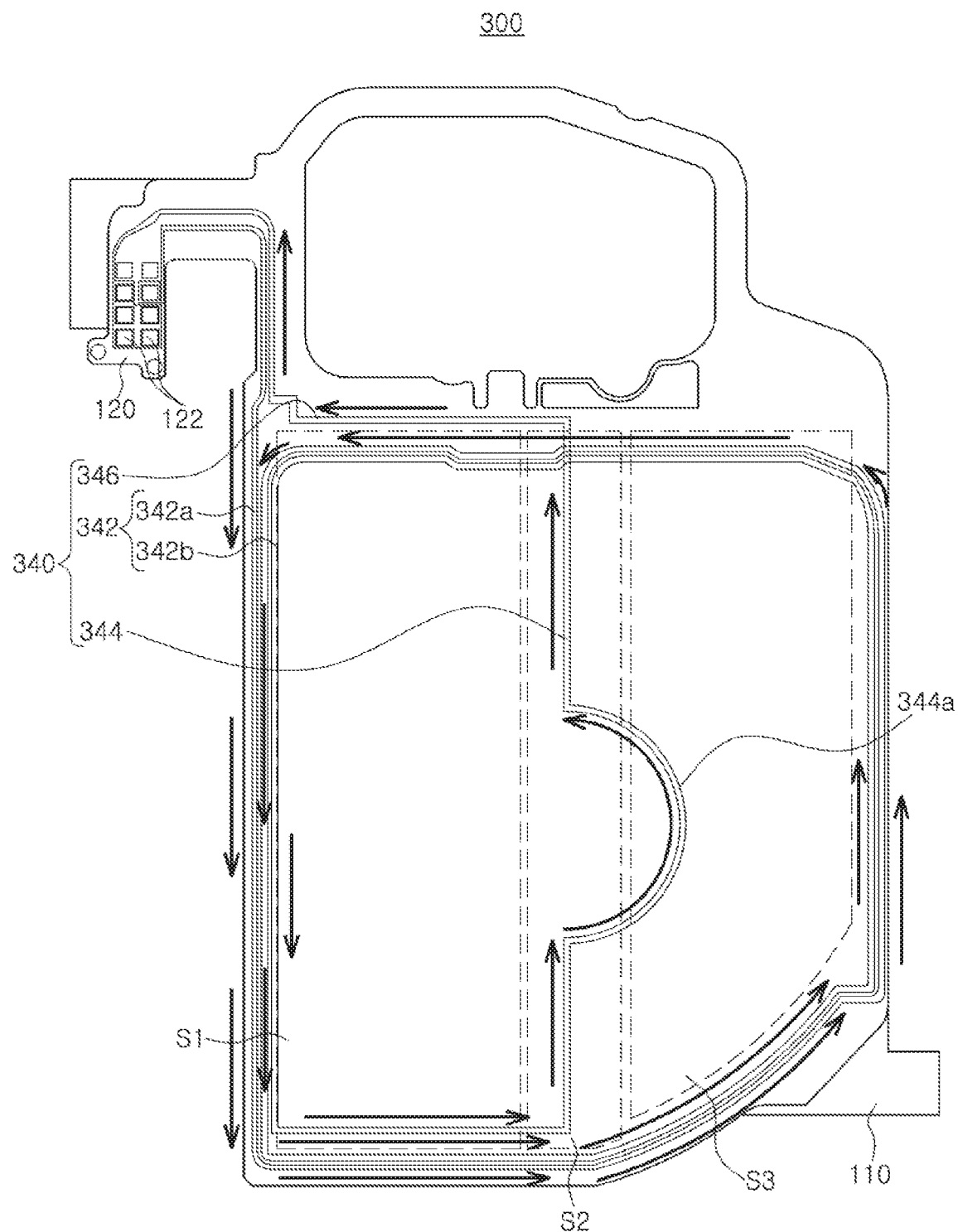
FIG. 8 is a plan view illustrating a second modified example of the coil for NFC.

FIG. 8 is a plan view illustrating a second modified example of the coil for NFC.

Referring to FIG. 8, a coil 340 for NFC may include a first pattern portion 342 connected to the input/output terminal unit 120 and rotating or turning in the other direction (a counterclockwise direction) along an edge of the board 110, a second pattern portion 344 connected to the first pattern portion 342 and traversing an internal area of the first pattern portion 342 to divide the internal area of the first pattern portion 342 into at least two portions, and a third pattern portion 346 having one end connected to the second pattern portion 344 and the other end connected to the input/output terminal unit 120.

The first pattern portion 342 may include a 1-1-th pattern portion 342a having one end connected to the connection terminals 122 of the input/output terminal unit 120 and having a spiral shape rotating in the other direction (the counterclockwise direction) along the edge of the board 110 and a 1-2-th pattern portion 342b connected to the 1-1-th pattern portion 342a and disposed inside the 1-1-th pattern portion 342a.

Meanwhile, the second pattern portion 344 may be disposed to traverse the internal area of the first pattern portion 342 in a longitudinal direction, and may have one end connected to the 1-2-th pattern portion 342b and the other end connected to the third pattern portion 346 described above. Meanwhile, the second pattern portion 344 may include a semicircular pattern 344a formed in a central portion thereof and having a semicircular shape.

In addition, the third pattern portion 346 may have one end connected to the second pattern portion 344 described above and the other end connected to the connection terminals 122 of the input/output terminal unit 120.

Meanwhile, when a current flows through the coil 340 for NFC, the current may flow in the order of the first pattern portion 342, the second pattern portion 344, and the third pattern portion 346 of the coil 340 for NFC. That is, when current flows from the connection terminals 122 of the input/output terminal unit 120 to the coil 340 for NFC, the current may flow in the counterclockwise direction along the 1-1-th pattern portion 342a of the first pattern portion 342, and then flow along the 1-2-th pattern portion 342b.

Then, the current may flow along the second pattern portion 344 connected to the 1-2-th pattern portion 342b. Here, the second pattern portion 344 traverses the internal area of the first pattern portion 342 to divide the internal area of the first pattern portion 342 into two, or a plurality of, portions, and the current may thus flow to traverse a central portion of the internal area of the first pattern portion 342.

Then, the current may flow along the third pattern portion 346 connected to the second pattern portion 344, and may finally flow to the connection terminals 122 of the input/output terminal unit 120.

In addition, intensities of magnetic flux of an area S1 disposed on a left portion of the board 110 formed by the first pattern portion 342 and the second pattern portion 344, an area S2 disposed between the area S1 disposed on the left portion of the board 110 and an area S3 disposed on a right portion of the board 110, and the area S3 disposed on the right portion of the board 110 formed by the first pattern portion 342 and the second pattern portion 344 may be large in a sequence of: the area S1 disposed on the left portion of the board 110 formed by the first pattern portion 342 and the second pattern portion 344, the area S2 disposed between the area S1 disposed on the left portion of the board 110 and the area S3 disposed on the right portion of the board 110, and the area S3 disposed on the right portion of the board 110 formed by the first pattern portion 342 and the second pattern portion 344.

That is, peak point indications of various tags may be more widely distributed as compared to the related art through the area S1 disposed on the left portion of the board 110 among the areas formed by the first pattern portion 342 and the second pattern portion 344, in other words, a pattern shape having a size corresponding to a card size.

As described above, an area having the pattern shape having the size corresponding to the card size and in which the peak point indications of the various tags are formed may be varied into an area different from an area in the exemplary embodiment described above.

Further, the third pattern portion 346 may be formed to reduce an offset magnetic flux in the area S3 disposed on the right portion of the board 110 formed by the first pattern portion 342 and the second pattern portion 344.

Further, magnetic flux having a sufficient intensity in the area S2 disposed between the area S1 that is needed to ensure performance and is disposed on the left portion of the board 110 and the area S3 disposed on the right portion of the board 110 may be obtained through the second pattern portion 344.

In addition, the semicircular pattern 344a is formed in the central portion of the second pattern portion 344, and performance deterioration due to offset magnetic flux generated in the surrounding portion of the semicircular pattern 344a may be reduced. In other words, the second pattern portion 344 does not have a spiral shape, but may include a semicircular pattern 344a of which one side is opened, such that an offset magnetic flux in the opened portion may be reduced to reduce performance deterioration.

Figure 9:
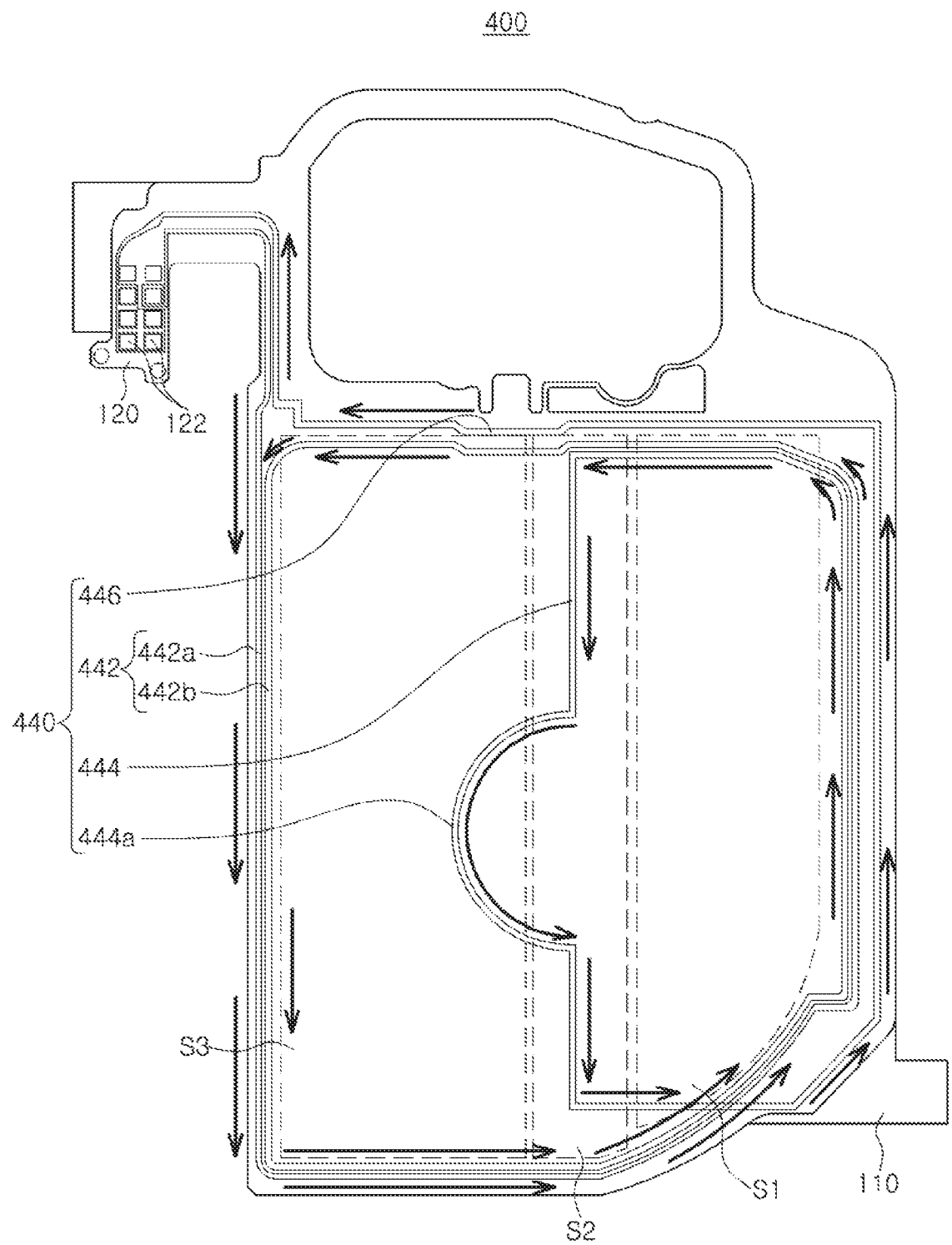
FIG. 9 is a plan view illustrating a third modified example of the coil for NFC.

FIG. 9 is a plan view illustrating a third modified example of the coil for NFC.

Referring to FIG. 9, a coil 440 for NFC may include a first pattern portion 442 connected to the input/output terminal unit 120 and rotating or turning in the other direction (a counterclockwise direction) along an edge of the board 110, a second pattern portion 444 connected to the first pattern portion 442 and traversing an internal area of the first pattern portion 442 to divide the internal area of the first pattern portion 442 into at least two portions, and a third pattern portion 446 having one end connected to the second pattern portion 444 and the other end connected to the input/output terminal unit 120.

The first pattern portion 442 may include a 1-1-th pattern portion 442a having one end connected to the connection terminals 122 of the input/output terminal unit 120 and having a spiral shape rotating in the other direction (the counterclockwise direction) along the edge of the board 110 and a 1-2-th pattern portion 442b connected to the 1-1-th pattern portion 442a and disposed inside the 1-1-th pattern portion 442a.

Meanwhile, the second pattern portion 444 may be disposed to traverse the internal area of the first pattern portion 442 in the longitudinal direction, and may have one end connected to the 1-2-th pattern portion 442b and the other end connected to the third pattern portion 446 described above. Meanwhile, the second pattern portion 444 may include a semicircular pattern 444a formed in a central portion thereof and having a semicircular shape.

In addition, the third pattern portion 446 may have one end connected to the second pattern portion 444 described above and the other end connected to the connection terminals 122 of the input/output terminal unit 120.

Meanwhile, when a current flows to the coil 440 for NFC, the current may flow in the order of the first pattern portion 442, the second pattern portion 444, and the third pattern portion 446 of the coil 440 for NFC. That is, when the current flows from the connection terminals 122 of the input/output terminal unit 120 to the coil 440 for NFC, the current may flow in the counterclockwise direction along the 1-1-th pattern portion 442a of the first pattern portion 442, and then flow along the 1-2-th pattern portion 442b.

Then, the current may flow along the second pattern portion 444 connected to the 1-2-th pattern portion 442b. Here, the second pattern portion 444 traverses the internal area of the first pattern portion 442 to divide the internal area of the first pattern portion 442 into at least two portions, and the current may thus flow to traverse the internal area of the first pattern portion 442.

Then, the current may flow along the third pattern portion 446 connected to the second pattern portion 444, and may finally flow to the connection terminals 122 of the input/output terminal unit 120.

In addition, intensities of magnetic flux of an area S1 disposed on a right portion of the board 110 formed by the first pattern portion 442 and the second pattern portion 444, an area S2 disposed between the area S1 disposed on the right portion of the board 110 and an area S3 disposed on a left portion of the board 110, and the area S3 disposed on the left portion of the board 110 formed by the first pattern portion 442 and the second pattern portion 444 may be large in a sequence of the area S1 disposed on the right portion of the board 110 formed by the first pattern portion 442 and the second pattern portion 444, the area S2 disposed between the area S1 disposed on the right portion of the board 110 and the area S3 disposed on the left portion of the board 110, and the area S3 disposed on the left portion of the board 110 formed by the first pattern portion 442 and the second pattern portion 444.

That is, peak point indications of various tags may be more widely distributed as compared to the related art through the area S1 disposed on the right portion of the board 110 formed by the first pattern portion 442 and the second pattern portion 444, in other words, a pattern shape having a size corresponding to a card size.

As described above, an area having the pattern shape having the size corresponding to the card size and in which the peak point indications of the various tags are formed may be varied into an area different from an area in the exemplary embodiment described above.

Further, the third pattern portion 446 may be formed to reduce offset magnetic flux in the area S3 disposed on the left portion of the board 110 formed by the first pattern portion 442 and the second pattern portion 444.

Further, magnetic flux having a sufficient intensity in the area S2 disposed between the area S1 that is needed to ensure performance and is disposed on the right portion of the board 110 and the area S3 disposed on the left portion of the board 110 may be obtained through the second pattern portion 444.

In addition, the semicircular pattern 444a is formed in the central portion of the second pattern portion 444, and performance deterioration due to offset magnetic flux generated in the surrounding portion of the semicircular pattern 444a may be reduced. In other words, the second pattern portion 444 does not have a spiral shape, but may include the semicircular pattern 444a of which one side is opened, such that an offset magnetic flux in the open portion may be reduced to reduce performance deterioration.

Figure 10:
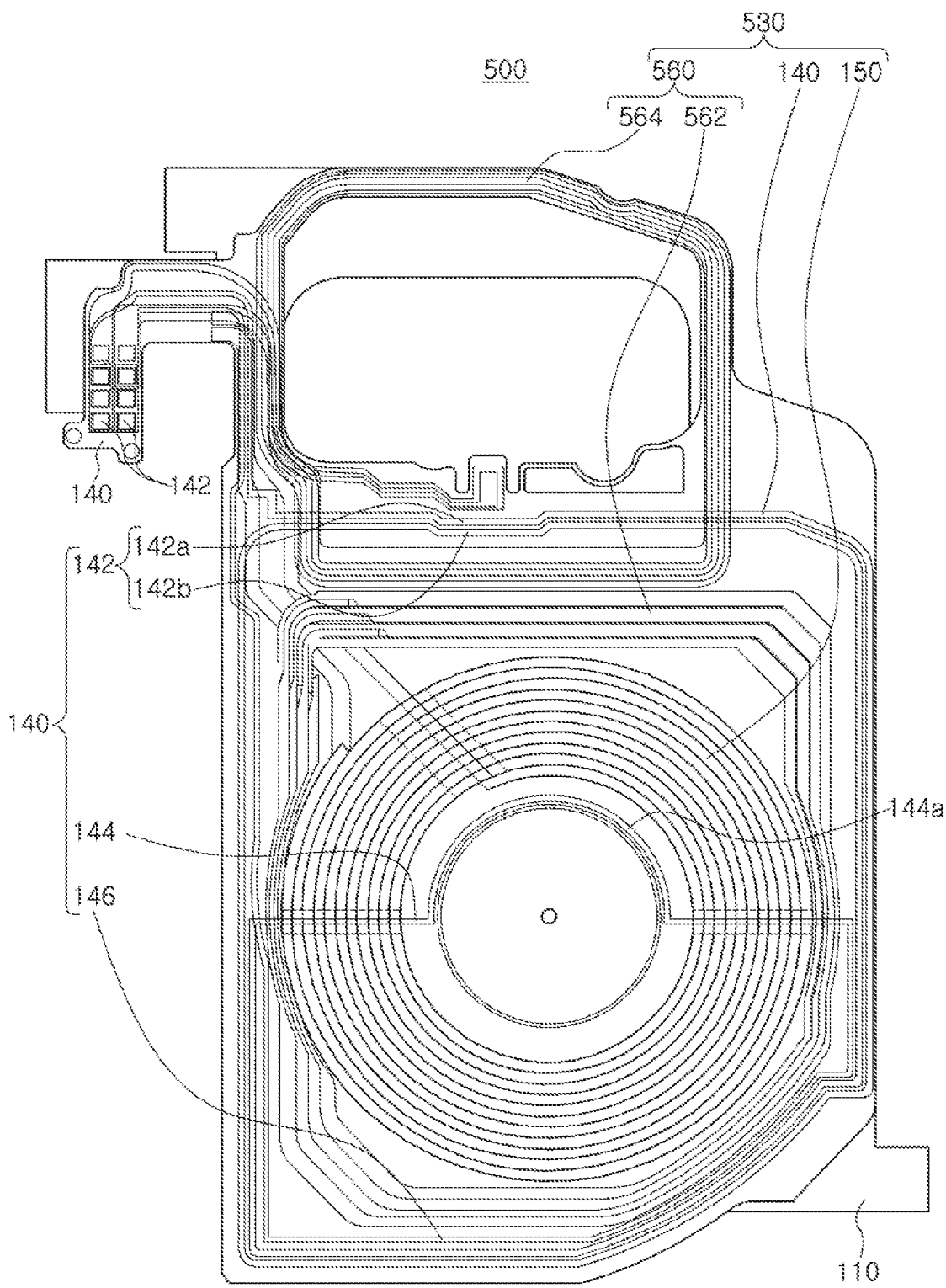
FIG. 10 is a plan view illustrating a coil module according to a third exemplary embodiment.

FIG. 10 is a plan view illustrating a coil module according to a third exemplary embodiment.

Referring to FIG. 10, a coil module 500 according to a third exemplary embodiment in the present disclosure may include a board 110, an input/output terminal unit 120, and a coil portion 530.

Meanwhile, the board 110 and the input/output terminal unit 120 are described in detail in the description of the coil module 100 according to the first exemplary embodiment described above, and a detailed description will thus be omitted.

The coil portion 530 may be formed on a surface of the board 110, and may be connected to the input/output terminal unit 120. As an example, the coil portion 530 may be formed of planar coils wound in the clockwise direction or in the counterclockwise direction and having a circular shape, an oval shape, or a polygonal shape.

The coil portion 530 may include a coil 140 for NFC disposed approximately along an edge of the board 110, a first coil 150 disposed in a central portion of the board 110, and a coil 560 for MST disposed outside the first coil 150 and above the first coil 150.

Meanwhile, the coil 140 for NFC and the first coil 150 are described in detail in the description of the coil module 100 according to the first exemplary embodiment described above, and a detailed description will be omitted.

The coil 560 for MST may include a first coil 562 for MST disposed outside the first coil 150, that is, between the coil 140 for NFC and the first coil 150 and a second coil 564 for MST disposed above the first coil 150.

Figure 11:
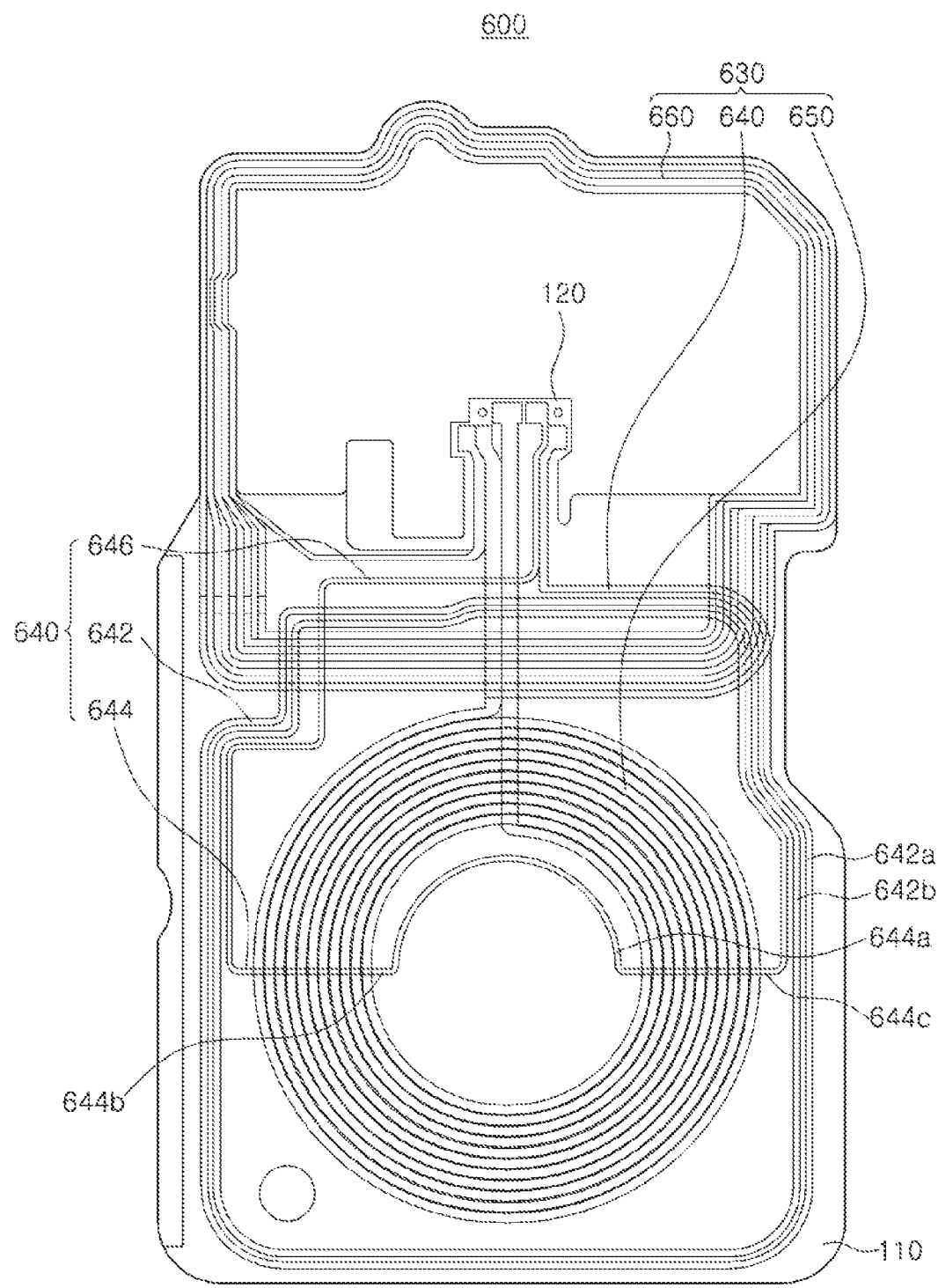
FIG. 11 is a plan view illustrating a coil module according to a fourth exemplary embodiment.

FIG. 11 is a plan view illustrating a coil module according to a fourth exemplary embodiment.

Referring to FIG. 11, a coil module 600 according to a fourth exemplary embodiment may include a board 110, an input/output terminal unit 120, and a coil portion 630.

Meanwhile, the board 110 and the input/output terminal unit 120 are different only in shapes and positions from those of the exemplary embodiments described above, and a detailed description will thus be omitted.

The coil portion 630 may be formed on a surface of the board 110, and may be connected to the input/output terminal unit 120. As an example, the coil portion 630 may be formed of planar coils wound in the clockwise direction or in the counterclockwise direction and having a circular shape, an oval shape, or a polygonal shape.

The coil portion 630 may include a coil 640 for NFC disposed approximately along an edge of the board 110, a first coil 650 disposed in a central portion of the board 110, and a coil 660 for MST disposed above the first coil 650.

Meanwhile, a detailed description of the first coil 650 and the coil 660 for MST will be replaced by the description of the first coil 150 and the coil 160 for MST described above.

The coil 640 for NFC may include a first pattern portion 642 connected to the input/output terminal unit 120 and rotating in one direction along the edge of the board 110, a second pattern portion 644 connected to the first pattern portion 642, and a third pattern portion 646 having one end connected to the second pattern portion 644 and the other end connected to the input/output terminal unit 120.

The first pattern portion 642 may have one end connected to the second pattern portion 644 and the other end connected to the input/output terminal unit 120. Further, the first pattern portion 642 may rotate in the clockwise direction, and may form an internal area. As an example, the first pattern portion 642 may have one, or a plurality of, turns.

As an example, the first pattern portion 642 may include a 1-1-th pattern portion 642a having one end connected to the input/output terminal unit 120 and rotating in the clockwise direction and a 1-2-th pattern portion 642b having one end connected to the 1-1-th pattern portion 642a and the other end connected to the second pattern portion 644 and rotating or turning in the clockwise direction.

In addition, the second pattern portion 644 may divide the internal area of the first pattern portion 642 into two portions, and traverse the internal area of the first pattern portion 642. In addition, the second pattern portion 644 may include a semicircular pattern 644a having a semicircular shape. That is, the second pattern portion 644 may include a first linear pattern 644b, the semicircular pattern 644a connected to the first linear pattern 644b, and a second linear pattern 644c connected to the semicircular pattern 644a.

In addition, the semicircular pattern 644a may have the semicircular shape protruding upward of the first and second linear patterns 644b and 644c.

The third pattern portion 646 may have one end connected to the second pattern portion 644 and the other end connected to the input/output terminal unit 120, without forming one turn. A case in which the third pattern portion 646 does not form one turn is described by way of example in the present exemplary embodiment, but the third pattern portion 646 is not limited thereto.

As described above, offset magnetic flux may be reduced and a wider recognition range may be obtained, through the coil 640 for NFC.

Figure 12:
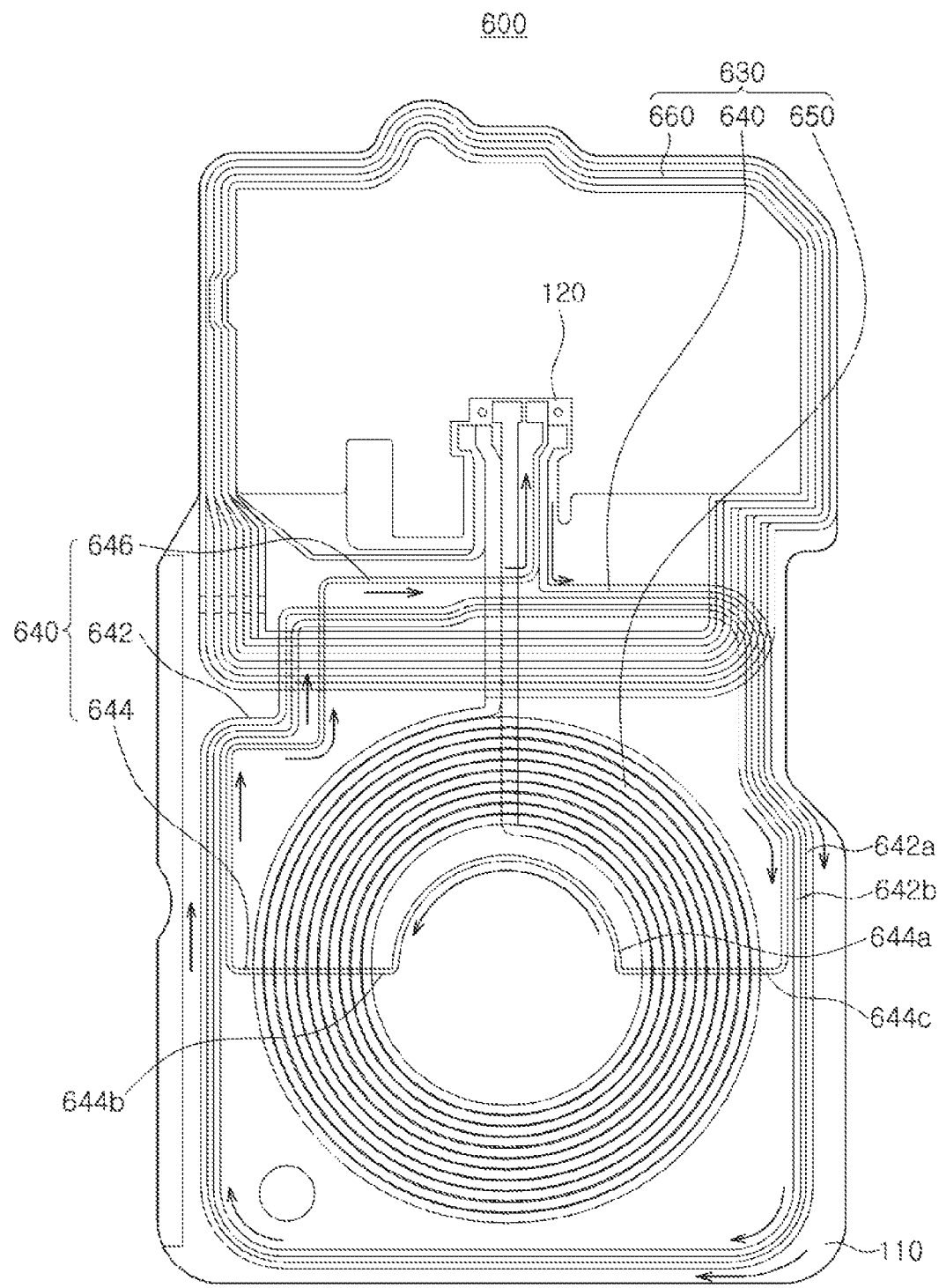
FIG. 12 is a view illustrating a current flow and a direction of magnetic flux of a coil for NFC included in the coil module according to a fourth exemplary embodiment.

FIG. 12 is a view illustrating a current flow and a direction of magnetic flux of a coil for NFC included in the coil module according to a fourth exemplary embodiment.

Referring to FIG. 12, when a current flows to the coil 640 for NFC, the current may flow in the order of the first pattern portion 642, the second pattern portion 644, and the third pattern portion 646 of the coil 640 for NFC. That is, when the current flows from the connection terminals 122 of the input/output terminal unit 120 to the coil 640 for NFC, the current may flow in the clockwise direction along the 1-1-th pattern portion 642a of the first pattern portion 642, and then flow along the 1-2-th pattern portion 642b.

Then, the current may flow along the second pattern portion 644 connected to the 1-2-th pattern portion 642b. Here, the second pattern portion 644 traverses the internal area of the first pattern portion 642 to divide the internal area of the first pattern portion 642 into at least two portions, and the current may thus flow to traverse the internal area of the first pattern portion 642.

Then, the current may flow in the clockwise direction along the third pattern portion 646 connected to the second pattern portion 644, and may finally flow to the connection terminals 122 of the input/output terminal unit 120.

Meanwhile, when the first coil 650 and the coil 640 for NFC are coplanar to each other as illustrated in FIG. 12, even though the first coil 650 and the coil 640 for NFC are not in direct contact with each other, it may be understood that the first coil 650 and the coil 640 for NFC are magnetically coupled to each other.

Therefore, magnetic flux generated by the current (for example, an alternating current (AC) current) applied to the coil 640 for NFC may generate electromotive force in the first coil 650. Since the electromotive force generated as described above is generated in a direction in which it hinders magnetic flux penetrating through the coil by Lenz's law, the electromotive force may generate an offset magnetic flux opposed to the magnetic flux generated from the coil 640 for NFC in an internal area of the coil 640 for NFC.

Therefore, in an internal area (an area having a circular shape) of the first coil 650, a null area in which a tag is not recognized since the magnetic flux generated from the coil 640 for NFC is weakened due to influence of the offset magnetic flux generated in the first coil 650 may be generated.

However, the influence of the offset magnetic flux may be reduced through the second pattern portion 644 as described above, and a recognition rate of the tags may thus be improved.

Further, the semicircular pattern 644a protruding upward of the first and second linear patterns 644b and 644c and having a semicircular shape may be included in the second pattern portion 644 to further reduce the influence of the offset magnetic flux, resulting in further improving the recognition rate of the tag(s).

That is, since a direction of magnetic flux generated from the second pattern portion 644 and a direction of magnetic flux generated from the first pattern portion 642 are opposite to each other, a direction of magnetic flux generated from the first coil 650 and the direction of the magnetic flux generated from the second pattern portion 644, that is, the semicircular pattern 644a may be the same. Therefore, magnetic flux offset phenomenon in the internal area of the first coil 650 may be reduced.

As a result, the influence of the offset magnetic flux is further reduced, and the recognition rate of the tag (s) may thus be further improved.

Figure 13:
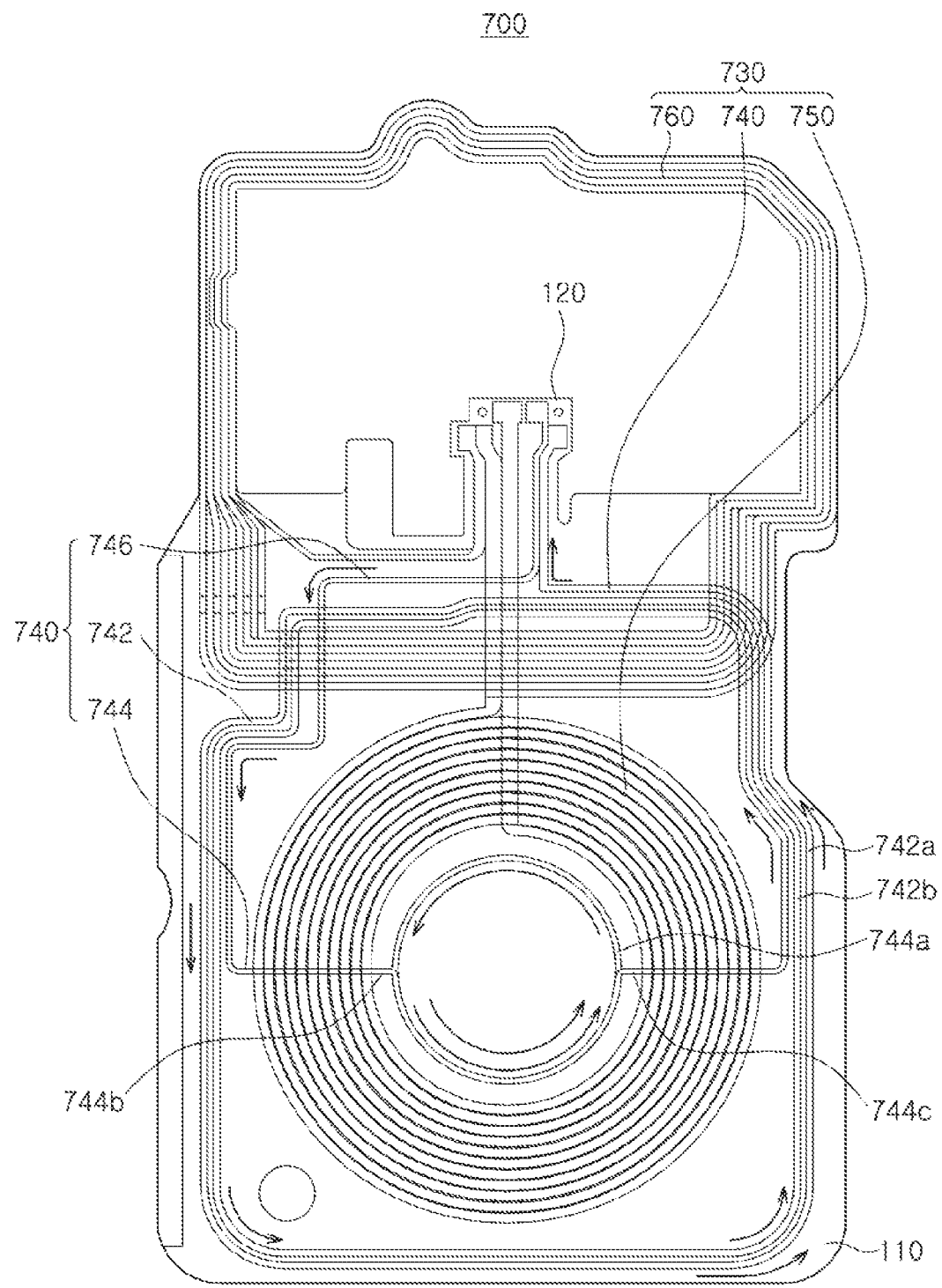
FIG. 13 is a plan view illustrating a coil module according to a fifth exemplary embodiment.

FIG. 13 is a plan view illustrating a coil module according to a fifth exemplary embodiment.

Referring to FIG. 13, a coil module 700 according to a fifth exemplary embodiment may include a board 110, an input/output terminal unit 120, and a coil portion 730.

Meanwhile, the board 110 and the input/output terminal unit 120 are different only in shapes and positions from those of the exemplary embodiment described above, and a detailed description will thus be omitted.

The coil portion 730 may be formed on a surface of the board 110, and may be connected to the input/output terminal unit 120. As an example, the coil portion 730 may be formed of planar coils wound in the clockwise direction or in the counterclockwise direction and having a circular shape, an oval shape, or a polygonal shape.

The coil portion 730 may include a coil 740 for NFC disposed approximately along an edge of the board 110, a first coil 750 disposed in a central portion of the board 110, and a coil 760 for MST disposed above the first coil 750.

Meanwhile, a detailed description of the first coil 750 and the coil 760 for MST was provided by the first coil 150 and the coil 160 for MST described above.

The coil 740 for NFC may include a first pattern portion 742 connected to the input/output terminal unit 120 and rotating or turning in one direction along the edge of the board 110, a second pattern portion 744 connected to the first pattern portion 742, and a third pattern portion 746 having one end connected to the second pattern portion 744 and the other end connected to the input/output terminal unit 120.

The first pattern portion 742 may have one end connected to the second pattern portion 744 and the other end connected to the input/output terminal unit 120. Further, the first pattern portion 742 may rotate in the clockwise direction, and may form an internal area. As an example, the first pattern portion 742 may have one, or a plurality of, turn(s).

As an example, the first pattern portion 742 may include a 1-1-th pattern portion 742a having one end connected to the input/output terminal unit 120 and rotating in the clockwise direction and a 1-2-th pattern portion 742b having one end connected to the 1-1-th pattern portion 742a and the other end connected to the second pattern portion 744 and rotating in the clockwise direction.

In addition, the second pattern portion 744 may divide the internal area of the first pattern portion 742 into two portions, and traverse the internal area of the first pattern portion 742. In addition, the second pattern portion 744 may include a circular pattern 744a having a circular shape. That is, the second pattern portion 744 may include a first linear pattern 744b, the circular pattern 744a connected to the first linear pattern 744b, and a second linear pattern 744c connected to the circular pattern 744a.

In addition, the circular pattern 744a may form 1.5 turns. As an example, the circular pattern 744a may be connected to the first linear pattern 744b to form one turn on an upper surface of the board 110, and then be formed in a semicircular shape on a lower surface of the board 110 and be connected to the second linear pattern 744c. However, the circular pattern 744a is not limited thereto. That is, when the board 110 includes a plurality of layers, a portion of the circular pattern 744a forming one turn and a portion of the circular pattern 744a formed in the semicircular shape may also be disposed on different layers.

As an example, the portion of the circular pattern 744a formed in the semicircular shape may be formed in a semicircular shape protruding downward in relation to the first and second linear patterns 744b and 744c.

The third pattern portion 746 may have one end connected to the second pattern portion 744 and the other end connected to the input/output terminal unit 120, without forming one turn. An embodiment in which the third pattern portion 746 does not form one turn is described by way of example in the present exemplary embodiment, but the third pattern portion 746 is not limited thereto.

Meanwhile, current flow will be described. When a current flows to the coil 740 for NFC, the current may flow in a sequence of the third pattern portion 746, the second pattern portion 744, and the first pattern portion 742 of the coil 740 for NFC.

In more detail, when the current flows from the connection terminals 122 of the input/output terminal unit 120 to the coil 740 for NFC, the current may flow along the third pattern portion 746, and then flow along the second pattern portion 744. That is, the current flow to the second pattern portion 744 may flow along the first linear pattern 744b, the circular pattern 744a connected to the first linear pattern 744b, and the second linear pattern 744c connected to the circular pattern 744a.

Then, the current may flow along the first pattern portion 742. In this case, the current may flow in a sequence of the 1-2-th pattern portion 742b and the 1-1-th pattern portion 742a. Then, the current may flow to the input/output terminal unit 120.

As described above, an offset magnetic flux in the internal area formed by the first pattern portion 742 may be reduced through the second pattern portion 744 including the circular pattern 744a to obtain a wider recognition range.

In other words, in the internal area formed by the first pattern portion 742, the circular pattern 744*a* may have 1.5 turns to generate magnetic flux greater than magnetic flux generated by the first coil 750 and directed in a direction opposite to a direction of the magnetic flux generated by the first coil 750, resulting in obtaining a wider recognition range.

Meanwhile, a case in which the current flows in a sequence of the third pattern portion 746, the second pattern portion 744, and the first pattern portion 742 is described by way of example in the present exemplary embodiment. However, the current is not limited thereto, but may also flow in the order of the first pattern portion 742, the second pattern portion 744, and the third pattern portion 746. Meanwhile, the current flow to the coil 740 for NFC may be an AC current.

As described above, the offset magnetic flux may be reduced and wider recognition range may be obtained, through the coil 740 for NFC.

Figure 14:
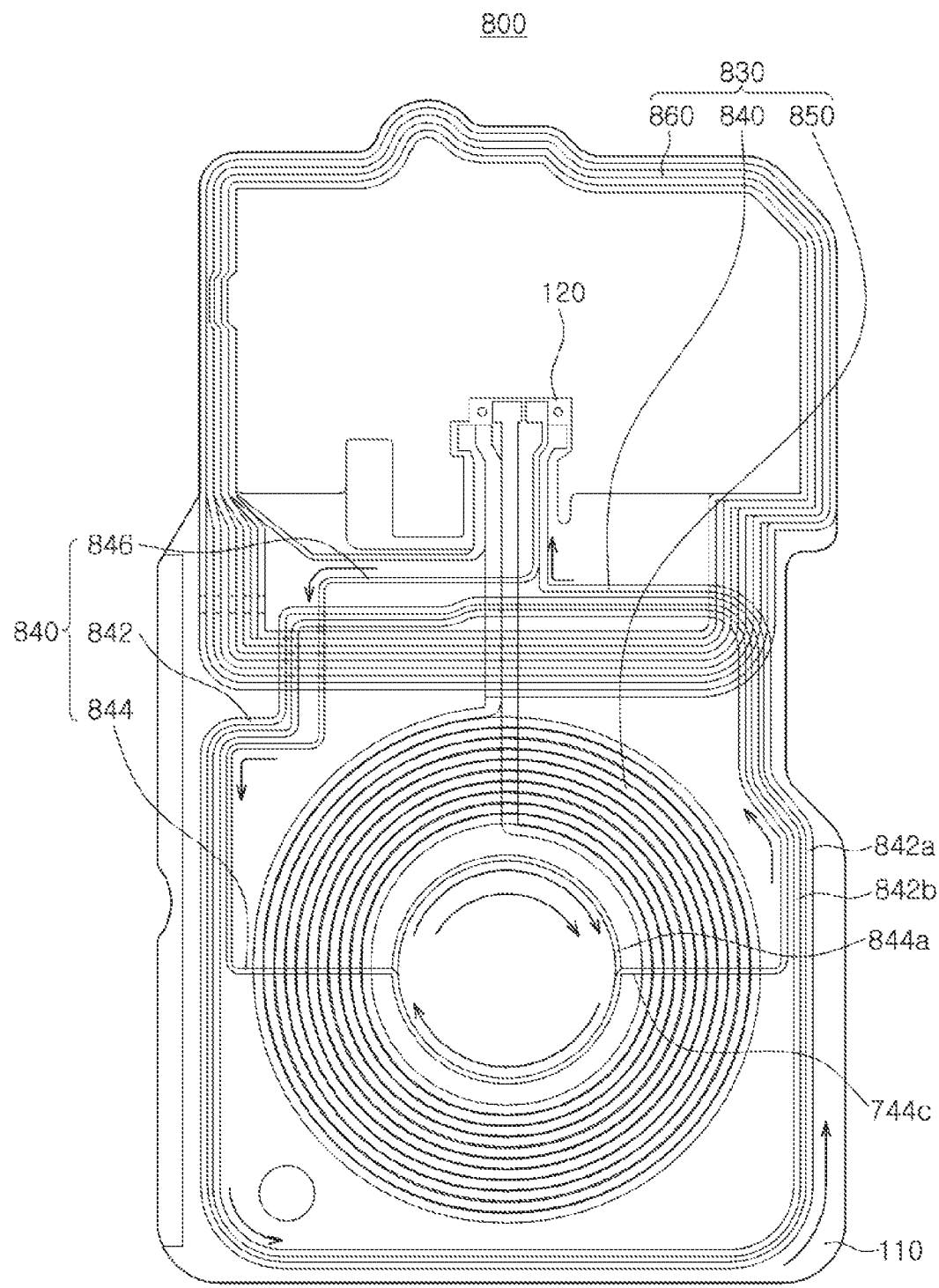
FIG. 14 is a plan view illustrating a coil module according to a sixth exemplary embodiment.

FIG. 14 is a plan view illustrating a coil module according to a sixth exemplary embodiment in the present disclosure.

Referring to FIG. 14, a coil module 800 according to a sixth exemplary embodiment in the present disclosure may include a board 110, an input/output terminal unit 120, and a coil portion 830.

Meanwhile, the board 110 and the input/output terminal unit 120 are different only in shapes and positions from those of the exemplary embodiments described above, and a detailed description thereof will thus be omitted.

The coil portion 830 may be formed on a surface of the board 110, and may be connected to the input/output terminal unit 120. As an example, the coil portion 830 may be formed of planar coils wound in the clockwise direction or in the counterclockwise direction and having a circular shape, an oval shape, or a polygonal shape.

The coil portion 830 may include a coil 840 for NFC disposed approximately along an edge of the board 110, a first coil 850 disposed in a central portion of the board 110, and a coil 860 for MST disposed above the first coil 850.

Meanwhile, a detailed description of the first coil 850 and the coil 860 for MST was provided by the first coil 150 and the coil 160 for MST described above.

The coil 840 for NFC may include a first pattern portion 842 connected to the input/output terminal unit 120 and rotating in one direction along the edge of the board 110, a second pattern portion 844 connected to the first pattern portion 842, and a third pattern portion 846 having one end connected to the second pattern portion 844 and the other end connected to the input/output terminal unit 120.

The first pattern portion 842 may have one end connected to the second pattern portion 844 and the other end connected to the input/output terminal unit 120. Further, the first pattern portion 842 may rotate in the clockwise direction, and may form an internal area. As an example, the first pattern portion 842 may have one, or a plurality of, turn.

As an example, the first pattern portion 842 may include a 1-1-th pattern portion 842*a* having one end connected to the input/output terminal unit 120 and rotating in the clockwise direction and a 1-2-th pattern portion 842*b* having one end connected to the 1-1-th pattern portion 842*a* and the other end connected to the second pattern portion 844 and rotating in the clockwise direction.

In addition, the second pattern portion 844 may divide the internal area of the first pattern portion 842 into two portions, and traverse the internal area of the first pattern portion 842. In addition, the second pattern portion 844 may include a circular pattern 844*a* having a circular shape. That is, the second pattern portion 844 may include a first linear pattern 844*b*, the circular pattern 844*a* connected to the first linear pattern 844*b*, and a second linear pattern 844*c* connected to the circular pattern 844*a*.

In addition, the circular pattern 844*a* may form 1.5 turns. As an example, the circular pattern 844*a* may be connected to the first linear pattern 844*b* to form one turn on an upper surface of the board 110, and then be formed in a semicircular shape on a lower surface of the board 110 and be connected to the second linear pattern 844*c*. However, the circular pattern 844*a* is not limited thereto. That is, when the board 110 includes a plurality of layers, a portion of the circular pattern 844*a* forming one turn and a portion of the circular pattern 844*a* formed in the semicircular shape may also be disposed on different layers.

As an example, the portion of the circular pattern 844*a* formed in the semicircular shape may be formed in a semicircular shape protruding upwardly in relation to the first and second linear patterns 844*b* and 844*c*.

The third pattern portion 846 may have one end connected to the second pattern portion 844 and the other end connected to the input/output terminal unit 120, without forming one turn. A case in which the third pattern portion 846 does not form one turn is described by way of example in the present exemplary embodiment, but the third pattern portion 846 is not limited thereto.

Meanwhile, current flow will be described. When a current flows to the coil 840 for NFC, the current may flow in a sequence of the third pattern portion 846, the second pattern portion 844, and the first pattern portion 842 of the coil 840 for NFC.

In more detail, when the current flows from the connection terminals 122 of the input/output terminal unit 120 to the coil 840 for NFC, the current may flow along the third pattern portion 846, and then flow along the second pattern portion 844. That is, the current flow to the second pattern portion 844 may flow along the first linear pattern 844*b*, the circular pattern 844*a* connected to the first linear pattern 844*b*, and the second linear pattern 844*c* connected to the circular pattern 844*a*.

Then, the current may flow along the first pattern portion 842. In this case, the current may flow in a sequence of the 1-2-th pattern portion 842*b* and the 1-1-th pattern portion 842*a*. Then, the current may flow to the input/output terminal unit 120.

As described above, offset magnetic flux in the internal area formed by the first pattern portion 842 may be reduced through the second pattern portion 844 including the circular pattern 844*a* to secure a wider recognition range.

That is, in the internal area of the first pattern portion 842, directions of magnetic fluxes generated by the first coil 850 and the second pattern portion 844 may be the same as each other, and magnetic flux offset phenomenon may thus be reduced. Therefore, a wider recognition range may be obtained.

Meanwhile, an embodiment in which the current flows in a sequence of the third pattern portion 846, the second pattern portion 844, and the first pattern portion 842 is described by way of example in the present exemplary embodiment. However, the current is not limited thereto, but may also flow in a sequence of the first pattern portion 842, the second pattern portion 844, and the third pattern portion 846. Meanwhile, the current applied to the coil 840 for NFC may be an AC current.

As described above, an offset magnetic flux may be reduced and a wider recognition range may be obtained, through the coil 840 for NFC.

Figure 15:
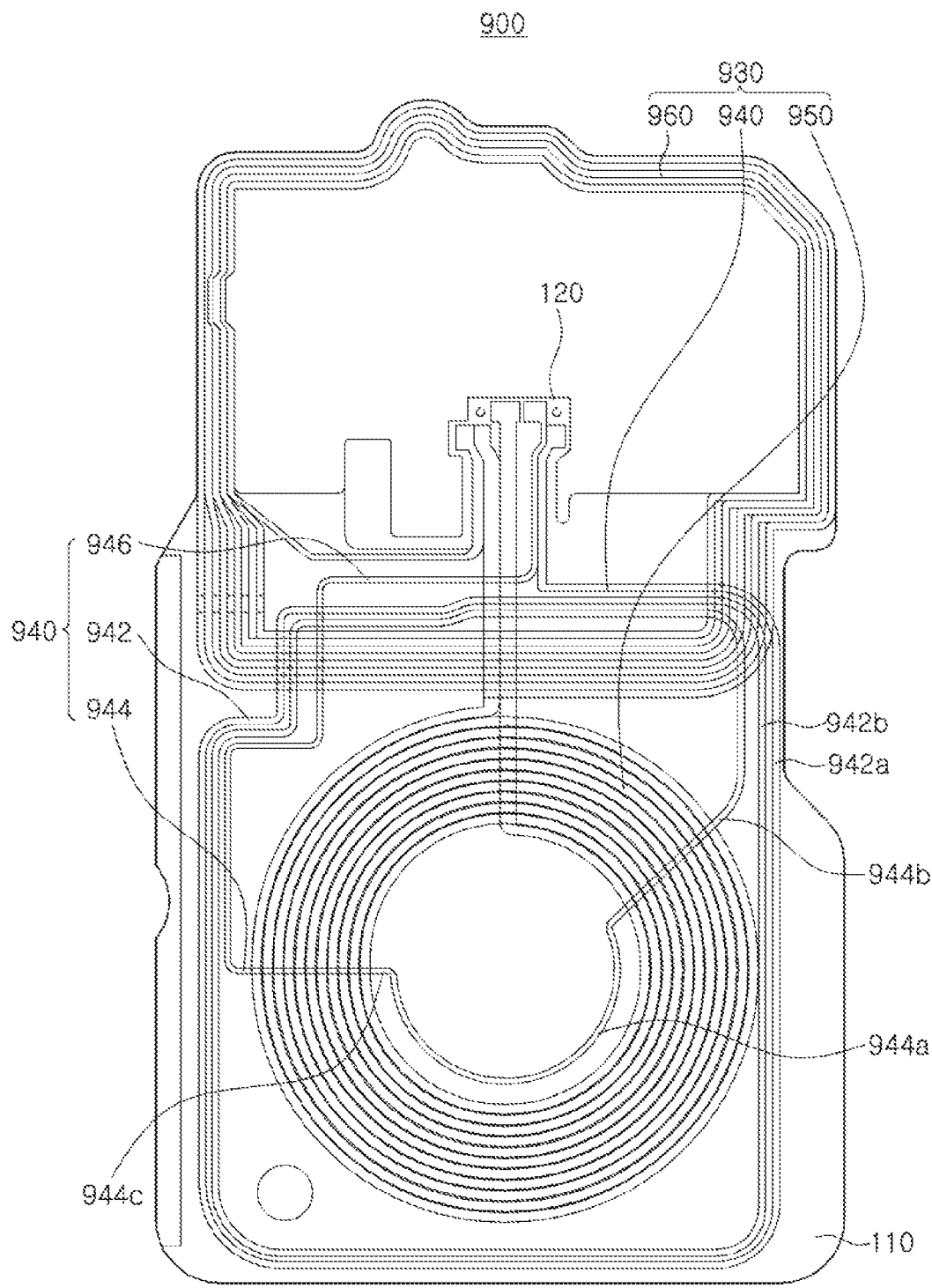
FIG. 15 is a plan view illustrating a coil module according to a seventh exemplary embodiment.

FIG. 15 is a plan view illustrating a coil module according to a seventh exemplary embodiment.

Referring to FIG. 15, a coil module 900 according to a seventh exemplary embodiment may include a board 110, an input/output terminal unit 120, and a coil portion 930.

Meanwhile, the board 110 and the input/output terminal unit 120 are different only in shapes and positions from those of the exemplary embodiment described above, and a detailed description will thus be omitted.

The coil portion 930 may be formed on one, or a plurality of, surface (s) of the board 110, and may be connected to the input/output terminal unit 120. As an example, the coil portion 930 may be formed of planar coils wound in the clockwise direction or in the counterclockwise direction and having a circular shape, an oval shape, or a polygonal shape.

The coil portion 930 may include a coil 940 for NFC disposed approximately along an edge of the board 110, a first coil 950 disposed in a central portion of the board 110, and a coil 960 for MST disposed above the first coil 950.

Meanwhile, a detailed description of the first coil 950 and the coil 960 for MST was provided by the first coil 150 and the coil 160 for MST described above.

The coil 940 for NFC may include a first pattern portion 942 connected to the input/output terminal unit 120 and rotating in one direction along the edge of the board 110, a second pattern portion 944 connected to the first pattern portion 942, and a third pattern portion 946 having one end connected to the second pattern portion 944 and the other end connected to the input/output terminal unit 120.

The first pattern portion 942 may have one end connected to the second pattern portion 944 and the other end connected to the input/output terminal unit 120. Further, the first pattern portion 942 may rotate in the clockwise direction, and may form an internal area. As an example, the first pattern portion 942 may have one, or a plurality of, turn(s).

As an example, the first pattern portion 942 may include a 1-1-th pattern portion 942a having one end connected to the input/output terminal unit 120 and rotating in the clockwise direction and a 1-2-th pattern portion 942b having one end connected to the 1-1-th pattern portion 942a and the other end connected to the second pattern portion 944 and rotating in the clockwise direction.

In addition, the second pattern portion 944 may divide the internal area of the first pattern portion 942 into two portions, and traverse the internal area of the first pattern portion 942. In addition, the second pattern portion 944 may include a ring pattern 944a having a ring shape.

In addition, the second pattern portion 944 may include an inclined pattern 944b.

In more detail, the second pattern portion 944 may include a horizontal pattern 944c connected to the third pattern portion 946, the ring pattern 944a having one end connected to the horizontal pattern 944c, and the inclined pattern 944b having one end connected to the ring pattern 944a and the other end connected to the first pattern portion 942.

As described above, an offset magnetic flux in the internal area of the first pattern portion 942 may be reduced and a wider recognition range may be obtained, through the second pattern portion 944.

In more detail, when the inclined pattern 944b is not included in the second pattern portion 944, a null area in an internal area of the first coil 950 may be generated at a low height from an upper surface of the board 110 up to 5 mm. In addition, when the inclined pattern 944b is not included, horizontal patterns 944c disposed at both sides of the ring pattern 944a may have an influence on the internal area of the first coil 950 at a low height. That is, the horizontal patterns 944c may generate magnetic fluxes in an opposite direction to a direction of magnetic flux generated by the ring pattern 944a at the low height of the internal area of the first coil 950. These magnetic fluxes may generate magnetic flux offset to contribute to generating the null area in the internal area of the first coil 950.

However, since the inclined pattern 944b is formed in the second pattern portion 944 as described above, a direction of magnetic flux generated from the second pattern portion 944 may be changed, resulting in reducing the magnetic flux offset. Therefore, the null area may be further reduced.

The third pattern portion 946 may have one end connected to the second pattern portion 944 and the other end connected to the input/output terminal unit 120, without forming one turn. A case in which the third pattern portion 946 does not form one turn is described by way of example in the present exemplary embodiment, but the third pattern portion 946 is not limited thereto.

As described above, an offset magnetic flux may be reduced and a wider recognition range may be obtained, through the coil 940 for NFC.

Figure 16:
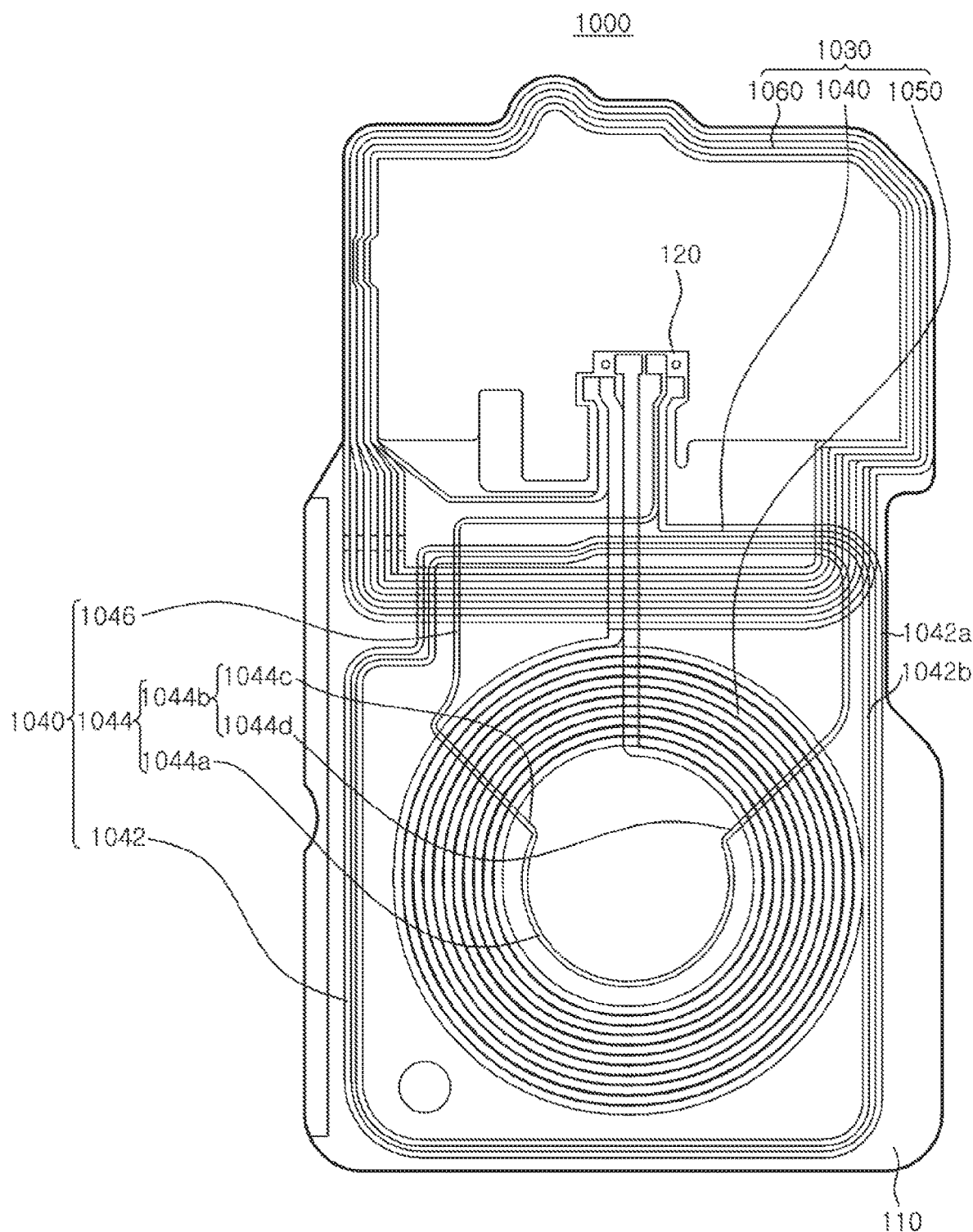
FIG. 16 is a plan view illustrating a coil module according to an eighth exemplary embodiment.

FIG. 16 is a plan view illustrating a coil module according to an eighth exemplary embodiment.

Referring to FIG. 16, a coil module 1000 according to an eighth exemplary embodiment may include a board 110, an input/output terminal unit 120, and a coil portion 1030.

Meanwhile, the board 110 and the input/output terminal unit 120 are different only in shapes and positions from those of the exemplary embodiment described above, and a detailed description will thus be omitted.

The coil portion 1030 may be formed on a surface of the board 110, and may be connected to the input/output terminal unit 120. As an example, the coil portion 1030 may be formed of planar coils wound in the clockwise direction or in the counterclockwise direction and having a circular shape, an oval shape, or a polygonal shape.

The coil portion 1030 may include a coil 1040 for NFC disposed approximately along an edge of the board 110, a first coil 1050 disposed in a central portion of the board 110, and a coil 1060 for MST disposed above the first coil 1050.

Meanwhile, a detailed description of the first coil 1050 and the coil 1060 for MST was provided by the first coil 150 and the coil 160 for MST described above.

The coil 1040 for NFC may include a first pattern portion 1042 connected to the input/output terminal unit 120 and rotating in one direction along the edge of the board 110, a second pattern portion 1044 connected to the first pattern portion 1042, and a third pattern portion 1046 having one end connected to the second pattern portion 1044 and the other end connected to the input/output terminal unit 120.

The first pattern portion 1042 may have one end connected to the second pattern portion 1044 and the other end connected to the input/output terminal unit 120. Further, the first pattern portion 1042 may rotate in the clockwise direction, and may form an internal area. As an example, the first pattern portion 1042 may have one, or a plurality of, turn(s).

As an example, the first pattern portion 1042 may include a 1-1-th pattern portion 1042a having one end connected to the input/output terminal unit 120 and rotating in the clockwise direction and a 1-2-th pattern portion 1042b having one end connected to the 1-1-th pattern portion 1042a and the other end connected to the second pattern portion 1044 and rotating in the clockwise direction.

In addition, the second pattern portion 1044 may divide the internal area of the first pattern portion 1042 into two portions, and traverse the internal area of the first pattern portion 1042. In addition, the second pattern portion 1044 may include a ring pattern 1044a having a ring shape. Meanwhile, an open portion of the ring pattern 1044a may be disposed in an upward direction.

In addition, the second pattern portion 1044 may include an inclined pattern 1044b.

In more detail, the second pattern portion 1044 may include the ring pattern 1044a and the inclined pattern 1044b connected to the ring pattern 1044a. Meanwhile, the inclined pattern 1044b may include a first inclined pattern 1044c connected to one end of the ring pattern 1044a and a second inclined pattern 1044d connected to the other end of the ring pattern 1044a.

In addition, a gradient of the first inclined pattern 1044c and a gradient of the second inclined pattern 1044d may be different from each other. Meanwhile, when the first inclined pattern 1044c has a negative gradient, the second inclined pattern 1044d may have a positive gradient.

Since the inclined pattern 1044b is formed in the second pattern portion 1044 as described above, a direction of magnetic flux generated from the second pattern portion 1044 may be changed, resulting in reducing magnetic flux offset. Therefore, a null area may be further reduced.

The third pattern portion 1046 may have one end connected to the second pattern portion 1044 and the other end connected to the input/output terminal unit 120, without forming one turn. A case in which the third pattern portion 1046 does not form one turn is described by way of example in the present exemplary embodiment, but the third pattern portion 1046 is not limited thereto.

As described above, an offset magnetic flux may be reduced and a wider recognition range may be obtained, through the coil 1040 for NFC.

Figure 17:
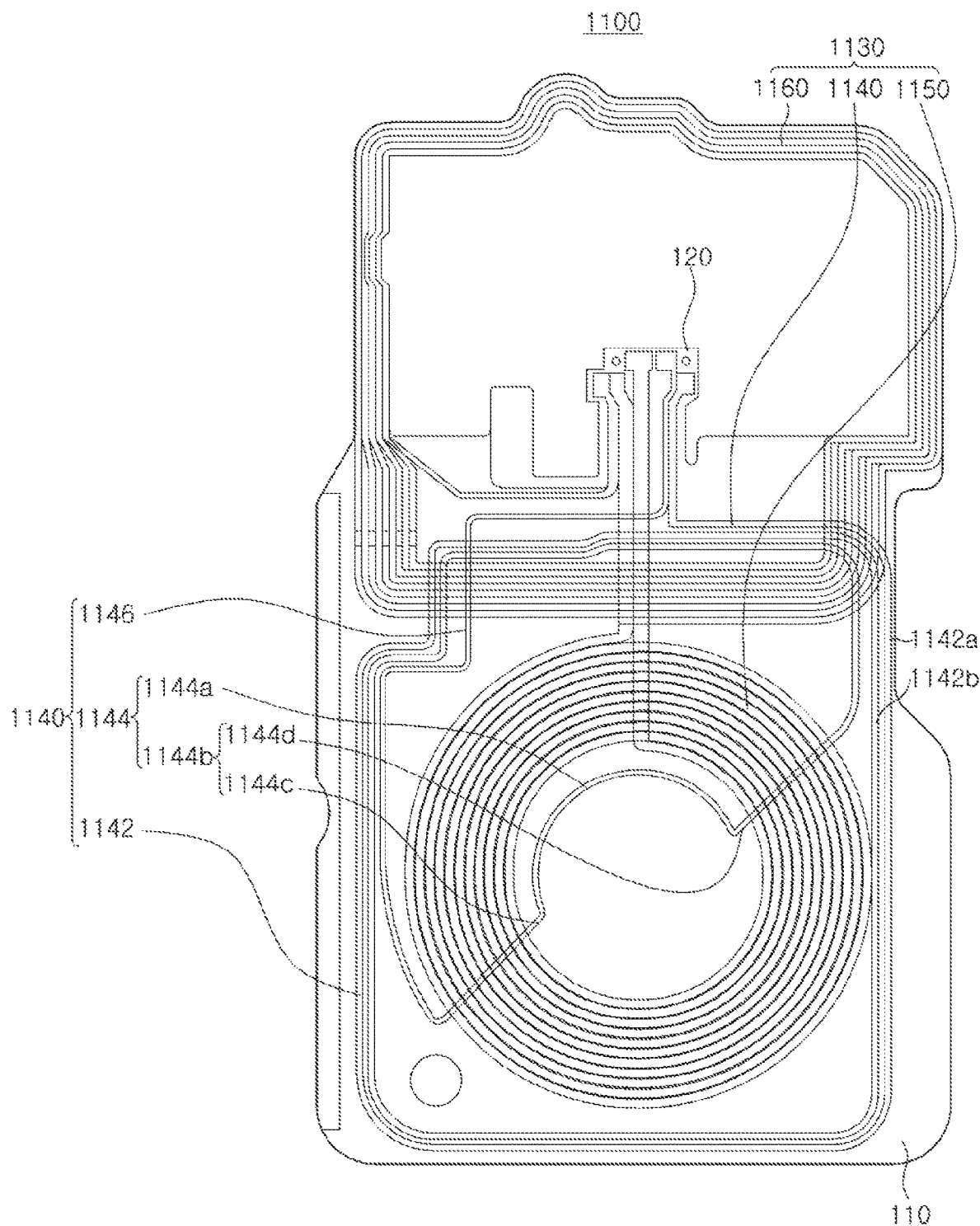
FIG. 17 is a plan view illustrating a coil module according to a ninth exemplary embodiment.

FIG. 17 is a plan view illustrating a coil module according to a ninth exemplary embodiment.

Referring to FIG. 17, a coil module 1100 according to a ninth exemplary embodiment may include a board 110, an input/output terminal unit 120, and a coil portion 1130.

Meanwhile, the board 110 and the input/output terminal unit 120 are different only in shapes and positions from those of the exemplary embodiment described above, and a detailed description therefor will be omitted.

The coil portion 1130 may be formed on one, or a plurality of, surface (s) of the board 110, and may be connected to the input/output terminal unit 120. As an example, the coil portion 1130 may be formed of planar coils wound in the clockwise direction or in the counterclockwise direction and having a circular shape, an oval shape, or a polygonal shape.

The coil portion 1130 may include a coil 1140 for NFC disposed approximately along an edge of the board 110, a first coil 1150 disposed in a central portion of the board 110, and a coil 1160 for MST disposed above the first coil 1150.

Meanwhile, a detailed description of the first coil 1150 and the coil 1160 for MST was provided by the first coil 150 and the coil 160 for MST described above.

The coil 1140 for NFC may include a first pattern portion 1142 connected to the input/output terminal unit 120 and rotating in one direction along the edge of the board 110, a second pattern portion 1144 connected to the first pattern portion 1142, and a third pattern portion 1146 having one end connected to the second pattern portion 1144 and the other end connected to the input/output terminal unit 120.

The first pattern portion 1142 may have one end connected to the second pattern portion 1144 and the other end connected to the input/output terminal unit 120. Further, the first pattern portion 1142 may rotate in the clockwise direction, and may have an internal area. As an example, the first pattern portion 1142 may have one, or a plurality of, turn(s).

As an example, the first pattern portion 1142 may include a 1-1-th pattern portion 1142a having one end connected to the input/output terminal unit 120 and rotating in the clockwise direction and a 1-2-th pattern portion 1142b having one end connected to the 1-1-th pattern portion 1142a and the other end connected to the second pattern portion 1144 and rotating in the clockwise direction.

In addition, the second pattern portion 1144 may divide the internal area of the first pattern portion 1142 into two portions, and traverse the internal area of the first pattern portion 1142. In addition, the second pattern portion 1144 may include a ring pattern 1144a having a ring shape. Meanwhile, an opened portion of the ring pattern 1144a may be disposed in a downward direction.

In addition, the second pattern portion 1144 may include an inclined pattern 1144b disposed to be inclined in relation to one side surface of the board 110.

In more detail, the second pattern portion 1144 may include the ring pattern 1144a and the inclined pattern 1144b connected to the ring pattern 1144a. Meanwhile, the inclined pattern 1144b may include a first inclined pattern 1144c connected to one end of the ring pattern 1144a and a second inclined pattern 1144d connected to the other end of the ring pattern 1144a.

In addition, a gradient of the first inclined pattern 1144c and a gradient of the second inclined pattern 1144d may be the same as each other or have the same sign. That is, when the first inclined pattern 1044c has a positive gradient, the second inclined pattern 1144d may also have a positive gradient.

Since the inclined pattern 1144b is formed in the second pattern portion 1144 as described above, a direction of magnetic flux generated from the second pattern portion 1144 may be changed, resulting in reducing magnetic flux offset. Therefore, a null area may be further reduced.

The third pattern portion 1146 may have one end connected to the second pattern portion 1144 and the other end connected to the input/output terminal unit 120, without forming one turn. An example in which the third pattern portion 1146 does not form one turn is described by way of example in the present exemplary embodiment, but the third pattern portion 1146 is not limited thereto.

As described above, an offset magnetic flux may be reduced and a wider recognition range may be obtained, through the coil 1140 for NFC.

Figure 18:
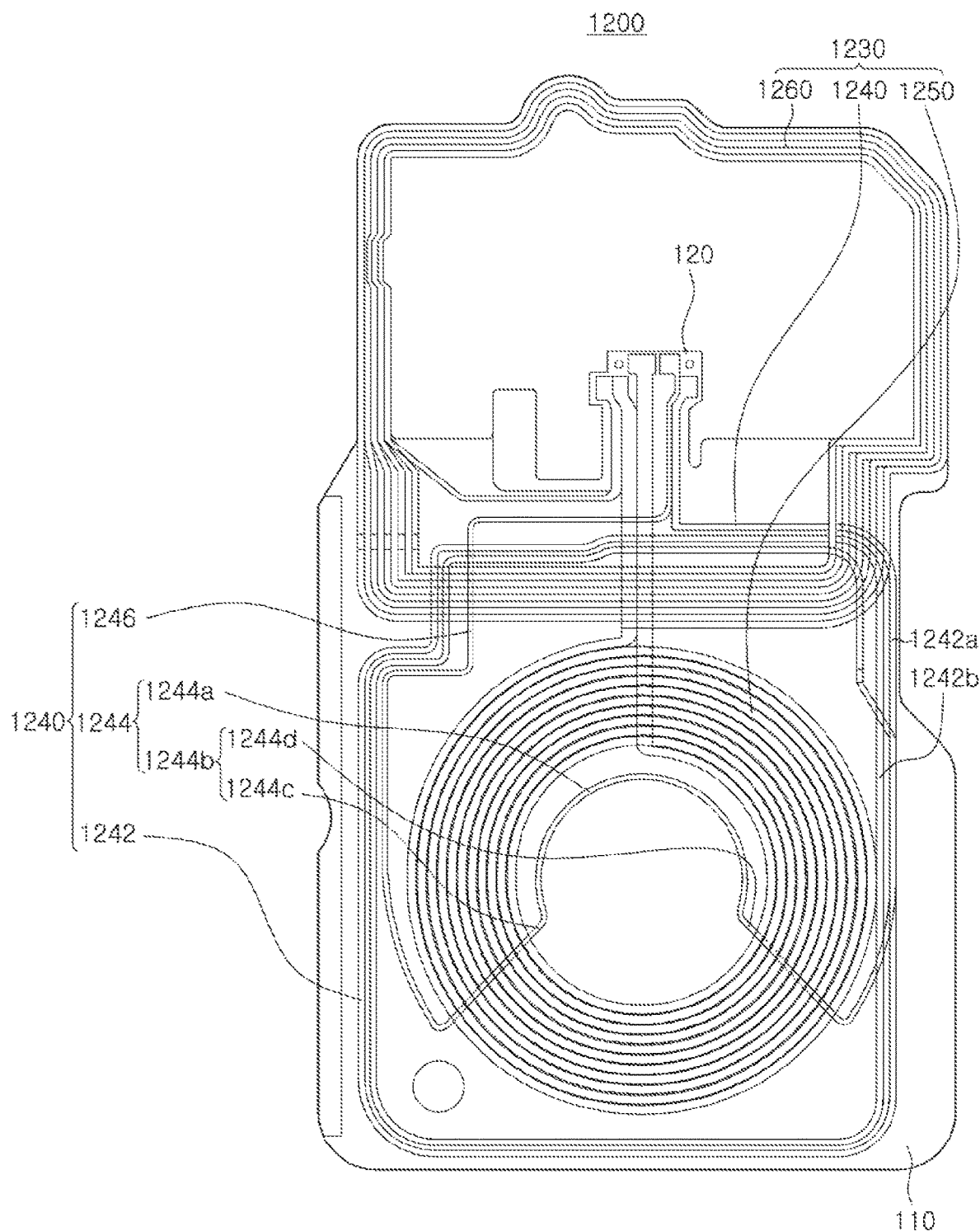
FIG. 18 is a plan view illustrating a coil module according to a tenth exemplary embodiment.

FIG. 18 is a plan view illustrating a coil module according to a tenth exemplary embodiment.

Referring to FIG. 18, a coil module 1200 according to a tenth exemplary embodiment may include a board 110, an input/output terminal unit 120, and a coil portion 1230.

Meanwhile, the board 110 and the input/output terminal unit 120 are different only in shapes and positions from those of the exemplary embodiments described above, and a detailed description therefor will thus be omitted.

The coil portion 1230 may be formed on a surface of the board 110, and may be connected to the input/output terminal unit 120. As an example, the coil portion 1230 may be formed of planar coils wound in the clockwise direction or in the counterclockwise direction and having a circular shape, an oval shape, or a polygonal shape.

The coil portion 1230 may include a coil 1240 for NFC disposed approximately along an edge of the board 110, a first coil 1250 disposed in a central portion of the board 110, and a coil 1260 for MST disposed above the first coil 1250.

Meanwhile, a detailed description of the first coil 1250 and the coil 1260 for MST was provided by the first coil 150 and the coil 160 for MST described above.

The coil 1240 for NFC may include a first pattern portion 1242 connected to the input/output terminal unit 120 and rotating in one direction along the edge of the board 110, a second pattern portion 1244 connected to the first pattern portion 1242, and a third pattern portion 1246 having one end connected to the second pattern portion 1244 and the other end connected to the input/output terminal unit 120.

The first pattern portion 1242 may have one end connected to the second pattern portion 1244 and the other end connected to the input/output terminal unit 120. Further, the first pattern portion 1242 may rotate in the clockwise direction, and may form an internal area. As an example, the first pattern portion 1242 may have one, or a plurality of, turn(s).

As an example, the first pattern portion 1242 may include a 1-1-th pattern portion 1242a having one end connected to the input/output terminal unit 120 and rotating in the clockwise direction and a 1-2-th pattern portion 1242b having one end connected to the 1-1-th pattern portion 1242a and the other end connected to the second pattern portion 1244 and rotating in the clockwise direction.

In addition, the second pattern portion 1244 may divide the internal area of the first pattern portion 1242 into two portions, and traverse the internal area of the first pattern portion 1242. In addition, the second pattern portion 1244 may include a ring pattern 1244a having a ring shape. Meanwhile, an opened portion of the ring pattern 1244a may be disposed in a downward direction.

In addition, the second pattern portion 1244 may include an inclined pattern 1244b disposed to be inclined in relation to one side surface of the board 110.

In more detail, the second pattern portion 1244 may include the ring pattern 1244a and the inclined pattern 1244b connected to the ring pattern 1244a. Meanwhile, the inclined pattern 1244b may include a first inclined pattern 1244c connected to one end of the ring pattern 1244a and a second inclined pattern 1244d connected to the other end of the ring pattern 1244a.

In addition, the gradient of the first inclined pattern 1244c and the gradient of the second inclined pattern 1244d may be different from each other. Meanwhile, when the first inclined pattern 1244c has a positive gradient, the second inclined pattern 1244d may have a negative gradient.

Since the inclined pattern 1244b is formed in the second pattern portion 1244 as described above, a direction of magnetic flux generated from the second pattern portion 1244 may be changed, resulting in reducing magnetic flux offset. Therefore, a null area may be further reduced.

The third pattern portion 1246 may have one end connected to the second pattern portion 1244 and the other end connected to the input/output terminal unit 120, without forming one turn. An embodiment in which the third pattern portion 1246 does not form one turn is described by way of example in the present exemplary embodiment, but the third pattern portion 1246 is not limited thereto.

As described above, an offset magnetic flux may be reduced and a wider recognition range may be obtained, through the coil 1240 for NFC.

Figure 19:
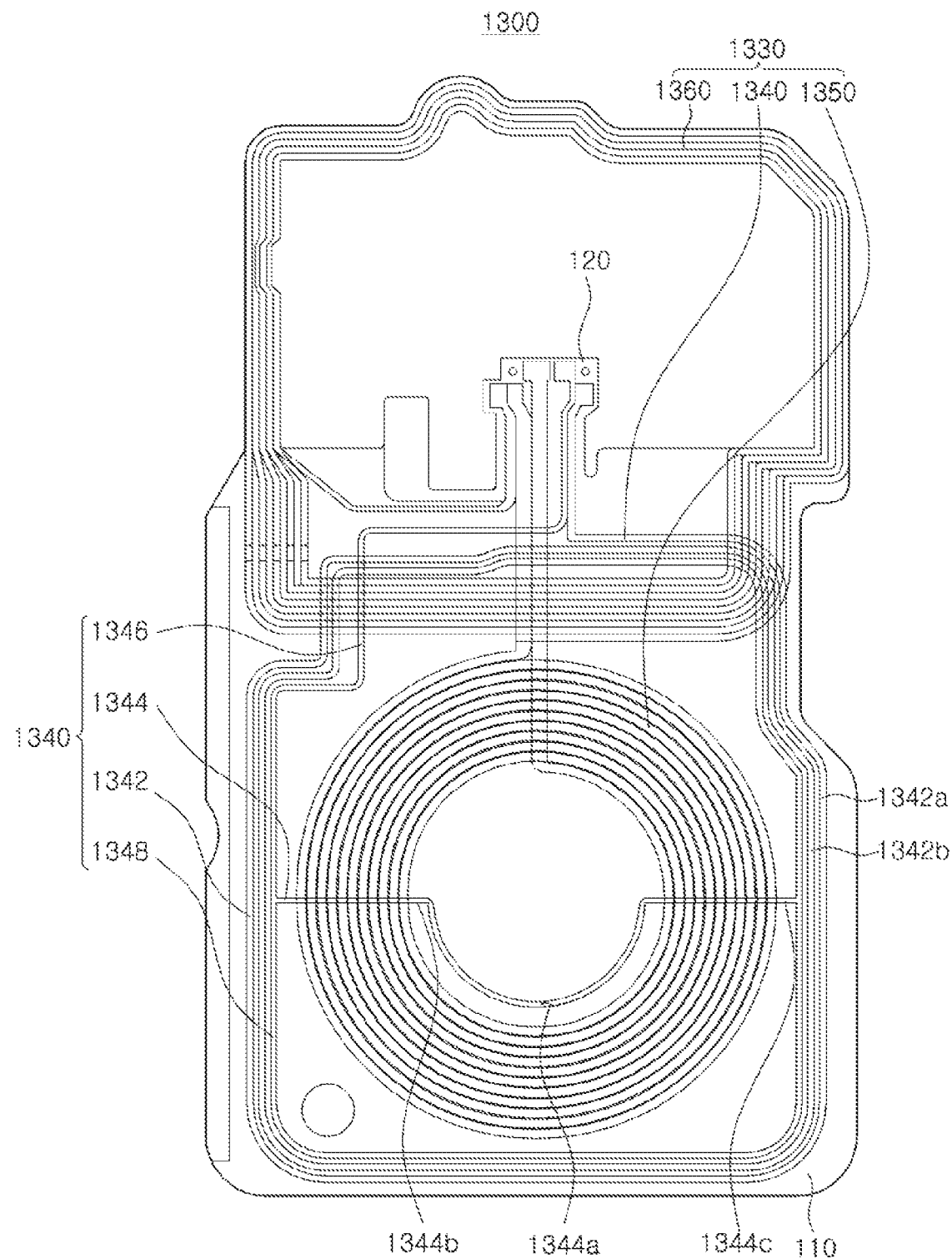
FIG. 19 is a plan view illustrating a coil module according to an eleventh exemplary embodiment.

FIG. 19 is a plan view illustrating a coil module according to an eleventh exemplary embodiment.

Referring to FIG. 19, a coil module 1300 according to an eleventh exemplary embodiment may include a board 110, an input/output terminal unit 120, and a coil portion 1330.

Meanwhile, the board 110 and the input/output terminal unit 120 are different only in shapes and positions from those of the exemplary embodiment described above, and a detailed description therefor will thus be omitted.

The coil portion 1330 may be formed on a surface of the board 110, and may be connected to the input/output terminal unit 120. As an example, the coil portion 1330 may be formed of planar coils wound in the clockwise direction or in the counterclockwise direction and having a circular shape, an oval shape, or a polygonal shape.

The coil portion 1330 may include a coil 1340 for NFC disposed approximately along an edge of the board 110, a first coil 1350 disposed in a central portion of the board 110, and a coil 1360 for MST disposed above the first coil 1350.

Meanwhile, a detailed description of the first coil 1350 and the coil 1360 for MST was provided by the first coil 150 and the coil 160 for MST described above.

The coil 1340 for NFC may include a first pattern portion 1342 connected to the input/output terminal unit 120 and rotating in one direction along the edge of the board 110, a second pattern portion 1344 connected to the first pattern portion 1342, a third pattern portion 1346 having one end connected to the second pattern portion 1344 and the other end connected to the input/output terminal unit 120, and a parallel connection pattern portion 1348 connected to both ends of the second pattern portion 1344.

The first pattern portion 1342 may have one end connected to the second pattern portion 1344 and the other end connected to the input/output terminal unit 120. Further, the first pattern portion 1342 may rotate in the clockwise direction, and may form an internal area. As an example, the first pattern portion 1342 may have one, or a plurality of, turn(s).

As an example, the first pattern portion 1342 may include a 1-1-th pattern portion 1342a having one end connected to the input/output terminal unit 120 and rotating in the clockwise direction and a 1-2-th pattern portion 1342b having one end connected to the 1-1-th pattern portion 1342a and the other end connected to the second pattern portion 1344 and rotating in the clockwise direction.

In addition, the second pattern portion 1344 may divide the internal area of the first pattern portion 1342 into two portions, and traverse the internal area of the first pattern portion 1342. In addition, the second pattern portion 1344 may include a semicircular pattern 1344a having a semicircular shape. That is, the second pattern portion 1344 may include a first linear pattern 1344b, the semicircular pattern 1344a connected to the first linear pattern 1344b, and a second linear pattern 1344c connected to the semicircular pattern 1344a.

In addition, the semicircular pattern 1344a may have the semicircular shape protruding downward of the first and second linear patterns 1344b and 1344c.

The third pattern portion 1346 may have one end connected to the second pattern portion 1344 and the other end connected to the input/output terminal unit 120, without forming one turn. A case in which the third pattern portion 1346 does not form one turn is described by way of example in the present exemplary embodiment, but the third pattern portion 1346 is not limited thereto.

Meanwhile, the parallel connection pattern portion 1348 may be connected to the both ends of the second pattern portion 1344. That is, the parallel connection pattern portion 1348 may be connected to the first pattern portion 1342 and the third pattern portion 1346 in parallel with the second pattern portion 1344.

As described above, an offset magnetic flux may be reduced and a wider recognition range may be obtained, through the coil 1340 for NFC.

Figure 20:
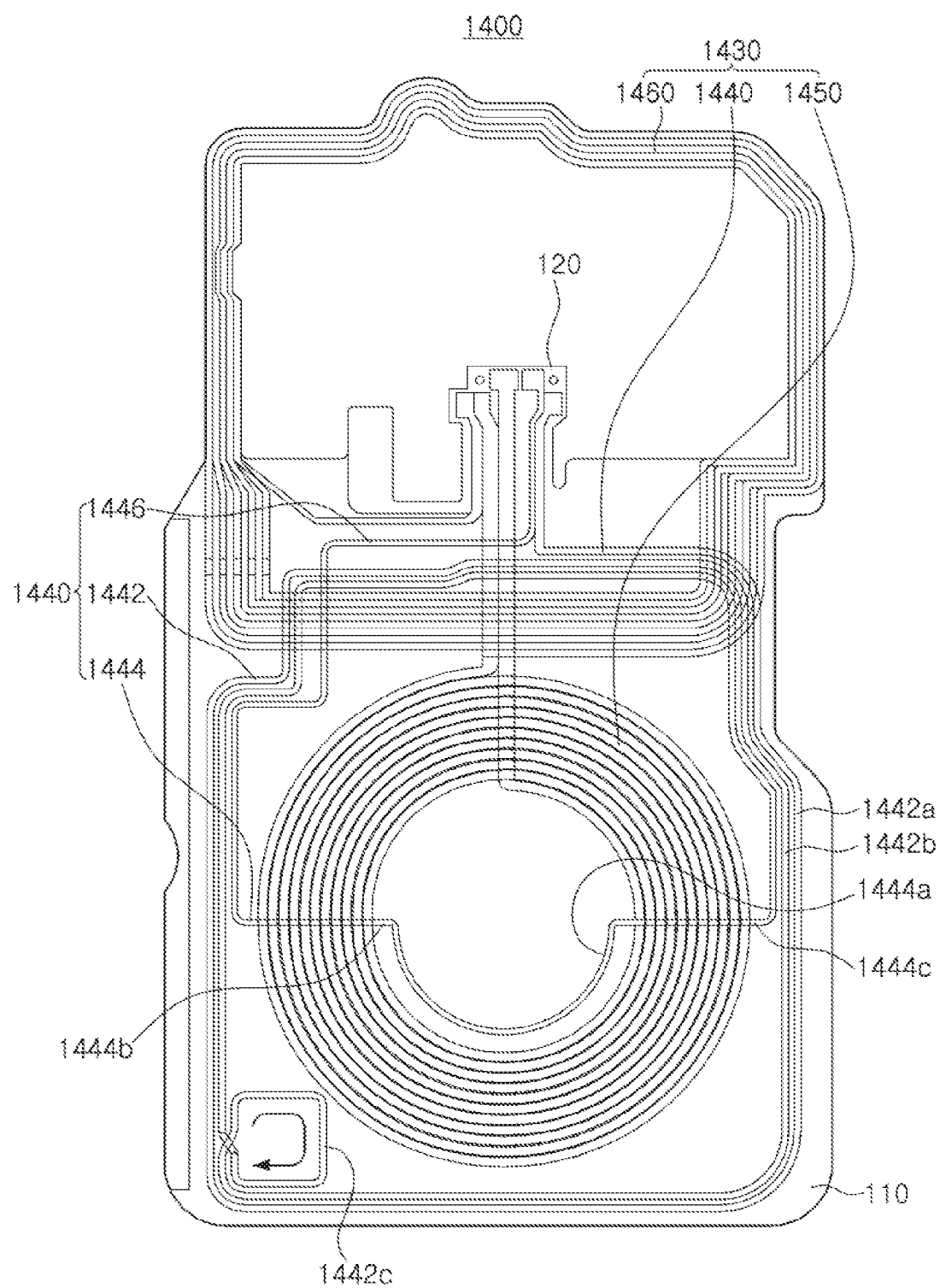
FIG. 20 is a plan view illustrating a coil module according to a twelfth exemplary embodiment.

FIG. 20 is a plan view illustrating a coil module according to a twelfth exemplary embodiment.

Referring to FIG. 20, a coil module 1400 according to a twelfth exemplary embodiment in the present disclosure may include a board 110, an input/output terminal unit 120, and a coil portion 1430.

Meanwhile, the board 110 and the input/output terminal unit 120 are different only in shapes and positions from those of the exemplary embodiment described above, and a detailed description therefor will thus be omitted.

The coil portion 1430 may be formed on one, or a plurality of, surface (s) of the board 110, and may be connected to the input/output terminal unit 120. As an example, the coil portion 1430 may be formed of planar coils wound in the clockwise direction or in the counter-clockwise direction and having a circular shape, an oval shape, or a polygonal shape.

The coil portion 1430 may include a coil 1440 for NFC disposed approximately along an edge of the board 110, a first coil 1450 disposed in a central portion of the board 110, and a coil 1460 for MST disposed above the first coil 1450.

Meanwhile, a detailed description of the first coil 1450 and the coil 1460 for MST will be replaced by the description of the first coil 150 and the coil 160 for MST described above.

The coil 1440 for NFC may include a first pattern portion 1442 connected to the input/output terminal unit 120 and rotating or turning in one direction along the edge of the board 110, a second pattern portion 1444 connected to the first pattern portion 1442, and a third pattern portion 1446 having one end connected to the second pattern portion 1444 and the other end connected to the input/output terminal unit 120.

The first pattern portion 1442 may have one end connected to the second pattern portion 1444 and the other end connected to the input/output terminal unit 120. Further, the first pattern portion 1442 may rotate in the clockwise direction, and may form an internal area. As an example, the first pattern portion 1442 may have one, or a plurality of, turn(s).

As an example, the first pattern portion 1442 may include a 1-1-th pattern portion 1442*a* having one end connected to the input/output terminal unit 120 and rotating in the clockwise direction and a 1-2-th pattern portion 1442*b* having one end connected to the 1-1-th pattern portion 1442*a* and the other end connected to the second pattern portion 1444 and rotating in the clockwise direction.

Meanwhile, the first pattern portion 1442 may include a recognition force increasing portion 1442*c* disposed in the internal area of the first pattern portion 1442. The recognition force increasing portion 1442*c* may be disposed in a lower internal area of two internal areas formed by the first pattern portion 1442 and the second pattern portion 1444, may rotate in one direction, and may be formed of a closed curved line having a ring shape. As an example, the recognition force increasing portion 1442*c* may be provided in the 1-2-th pattern portion 1442*b*, and may have a rectangular ring shape.

In addition, the recognition force increasing portion 1442*c* may rotate in the same direction as a rotation direction of the first pattern portion 1442, that is, the clockwise direction to allow a magnetic field to be formed in the same direction (for example, a direction from an upper surface of the board toward a lower surface of the board) as that of a magnetic field formed in the surrounding of the recognition force increasing portion 1442*c*, resulting in an increase in recognition force of the coil 1440 for NFC.

In other words, a null area is generated at a low height from the upper surface of the board 110 up to approximately 5 mm, but the recognition force increasing portion 1442*c* may be formed to form a magnetic field higher than that of the surrounding of the recognition force increasing portion 1442*c*, resulting in the increase in the recognition force at low height.

In addition, the second pattern portion 1444 may divide the internal area of the first pattern portion 1442 into two portions, and traverse the internal area of the first pattern portion 1442. In addition, the second pattern portion 1444 may include a semicircular pattern 1444*a* having a semicircular shape. That is, the second pattern portion 1444 may include a first linear pattern 1444*b*, the semicircular pattern 1444*a* connected to the first linear pattern 1444*b*, and a second linear pattern 1444*c* connected to the semicircular pattern 1444*a*.

In addition, the semicircular pattern 1444*a* may have the semicircular shape protruding downward of the first and second linear patterns 1444*b* and 1444*c*.

The third pattern portion 1446 may have one end connected to the second pattern portion 1444 and the other end connected to the input/output terminal unit 120, without forming one turn. A case in which the third pattern portion 1446 does not form one turn is described by way of example in the present exemplary embodiment, but the third pattern portion 1446 is not limited thereto.

As described above, an offset magnetic flux may be reduced and a wider recognition range may be obtained, through the coil 1440 for NFC.

Further, the recognition force of the coil 1440 for NFC in the surrounding area of the recognition force increasing portion 1442*c* may be increased through the recognition force increasing portion 1442*c*.

Figure 21:
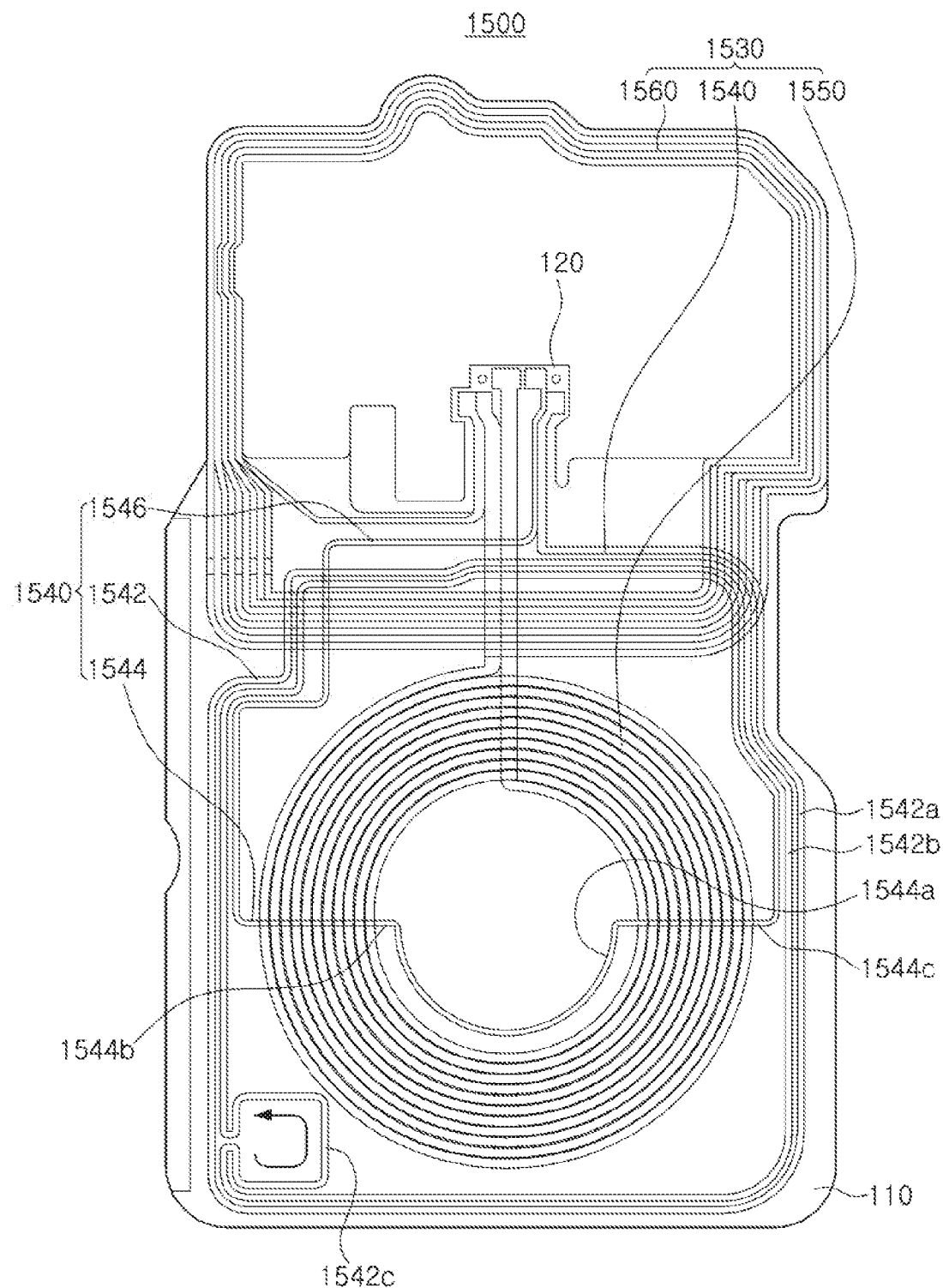
FIG. 21 is a plan view illustrating a coil module according to a thirteenth exemplary embodiment.

FIG. 21 is a plan view illustrating a coil module according to a thirteenth exemplary embodiment.

Referring to FIG. 21, a coil module 1500 according to a thirteenth exemplary embodiment may include a board 110, an input/output terminal unit 120, and a coil portion 1530.

Meanwhile, the board 110 and the input/output terminal unit 120 are different only in shapes and positions from those of the exemplary embodiment described above, and a detailed description therefor will thus be omitted.

The coil portion 1530 may be formed on one, or a plurality of, surface (s) of the board 110, and may be connected to the input/output terminal unit 120. As an example, the coil portion 1530 may be formed of planar coils wound in the clockwise direction or in the counter-clockwise direction and having a circular shape, an oval shape, or a polygonal shape.

The coil portion 1530 may include a coil 1540 for NFC disposed approximately along an edge of the board 110, a first coil 1550 disposed in a central portion of the board 110, and a coil 1560 for MST disposed above the first coil 1550.

Meanwhile, a detailed description of the first coil 1550 and the coil 1560 for MST will be replaced by the description of the first coil 150 and the coil 160 for MST described above.

The coil 1540 for NFC may include a first pattern portion 1542 connected to the input/output terminal unit 120 and rotating in one direction along the edge of the board 110, a second pattern portion 1544 connected to the first pattern portion 1542, and a third pattern portion 1546 having one end connected to the second pattern portion 1544 and the other end connected to the input/output terminal unit 120.

The first pattern portion 1542 may have one end connected to the second pattern portion 1544 and the other end connected to the input/output terminal unit 120. Further, the first pattern portion 1542 may rotate in the clockwise direction, and may have an internal area. As an example, the first pattern portion 1542 may have one, or a plurality of, turn(s).

As an example, the first pattern portion 1542 may include a 1-1-th pattern portion 1542a having one end connected to the input/output terminal unit 120 and rotating in the clockwise direction and a 1-2-th pattern portion 1542b having one end connected to the 1-1-th pattern portion 1542a and the other end connected to the second pattern portion 1544 and rotating in the clockwise direction.

Meanwhile, the first pattern portion 1542 may include a recognition force increasing portion 1542c disposed in the internal area of the first pattern portion 1542. The recognition force increasing portion 1542c may be disposed at a lower internal area of two internal areas formed by the first pattern portion 1542 and the second pattern portion 1544, may rotate in the other direction, and may be formed of a closed curved line having a ring shape. As an example, the recognition force increasing portion 1542c may be provided in the 1-2-th pattern portion 1542b, and may have a rectangular ring shape.

In addition, the recognition force increasing portion 1542c may rotate in an opposite direction to a rotation direction of the first pattern portion 1542, that is, the counterclockwise direction to allow a magnetic field to be formed in an opposite direction (for example, a direction from a lower surface of the board toward an upper surface of the board) to that of a magnetic field formed in the surrounding area of the recognition force increasing portion 1542c, resulting in an increase in recognition force of the coil 1540 for NFC.

In other words, a null area is generated at a low height from the upper surface of the board 110 up to approximately 5 mm, but the recognition force increasing portion 1542c may be formed to form a magnetic field relatively lower than that of the surrounding area of the recognition force increasing portion 1542c, resulting in the increase in the recognition force at low height.

In addition, the second pattern portion 1544 may divide the internal area of the first pattern portion 1542 into two portions, and traverse the internal area of the first pattern portion 1542. In addition, the second pattern portion 1544 may include a semicircular pattern 1544a having a semicircular shape. That is, the second pattern portion 1544 may include a first linear pattern 1544b, the semicircular pattern 1544a connected to the first linear pattern 1544b, and a second linear pattern 1544c connected to the semicircular pattern 1544a.

In addition, the semicircular pattern 1544a may have the semicircular shape protruding downward of the first and second linear patterns 1544b and 1544c.

The third pattern portion 1546 may have one end connected to the second pattern portion 1544 and the other end connected to the input/output terminal unit 120, without forming one turn. A case in which the third pattern portion 1546 does not form one turn is described by way of example in the present exemplary embodiment, but the third pattern portion 1546 is not limited thereto.

As described above, an offset magnetic flux may be reduced and a wider recognition range may be secured, through the coil 1540 for NFC.

Further, the recognition force of the coil 1540 for NFC in the surrounding of the recognition force increasing portion 1542c may be increased through the recognition force increasing portion 1542c.

Figure 22:
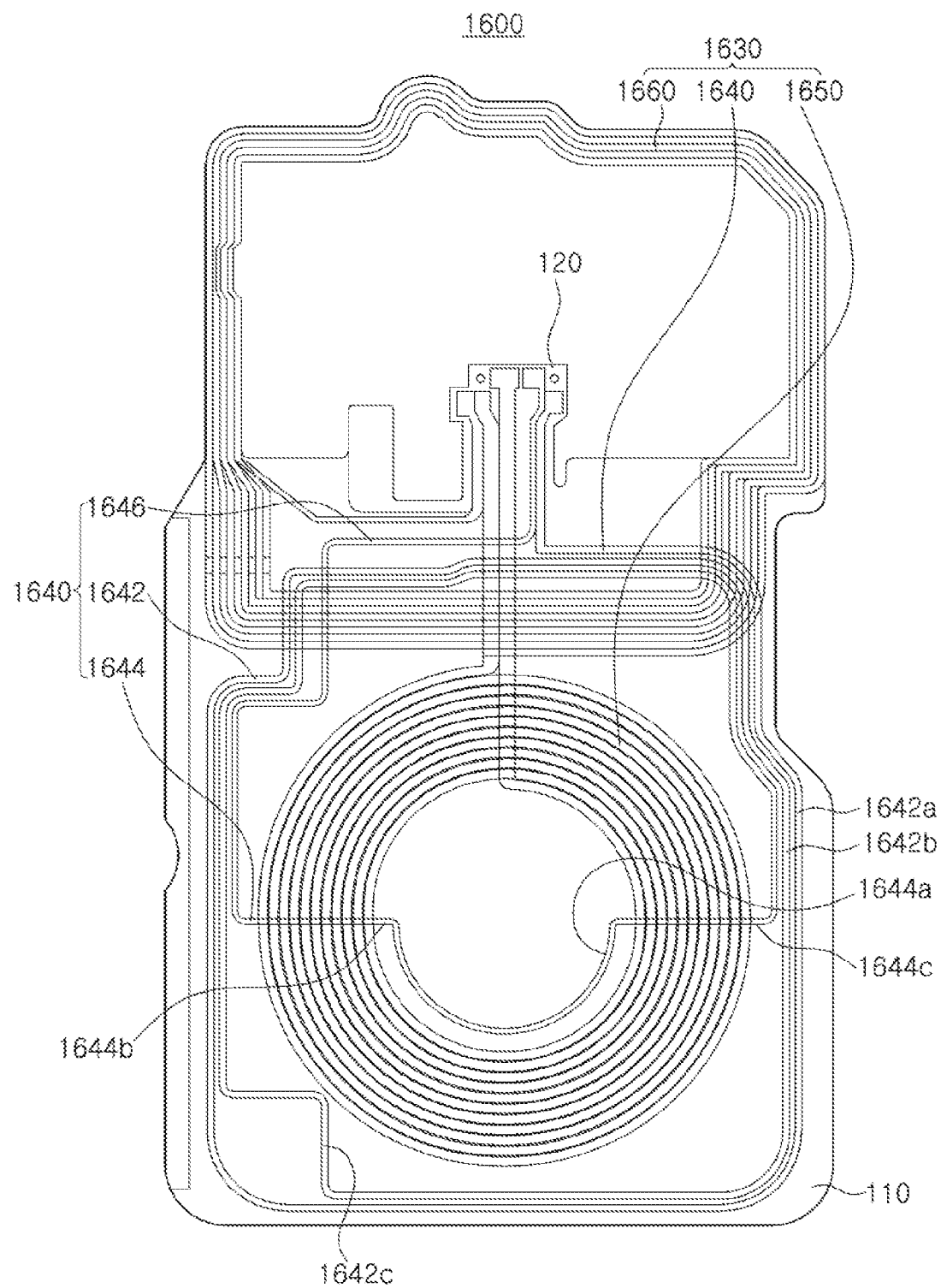
FIG. 22 is a plan view illustrating a coil module according to a fourteenth exemplary embodiment.

FIG. 22 is a plan view illustrating a coil module according to a fourteenth exemplary embodiment.

Referring to FIG. 22, a coil module 1600 according to a fourteenth exemplary embodiment may include a board 110, an input/output terminal unit 120, and a coil portion 1630.

Meanwhile, the board 110 and the input/output terminal unit 120 are different only in shapes and positions from those of the exemplary embodiment described above, and a detailed description therefor will thus be omitted.

The coil portion 1630 may be formed on a surface of the board 110, and may be connected to the input/output terminal unit 120. As an example, the coil portion 1630 may be formed of planar coils wound in the clockwise direction or in the counterclockwise direction and having a circular shape, an oval shape, or a polygonal shape.

The coil portion 1630 may include a coil 1640 for NFC disposed approximately along an edge of the board 110, a first coil 1650 disposed in a central portion of the board 110, and a coil 1660 for MST disposed above the first coil 1650.

Meanwhile, a detailed description of the first coil 1650 and the coil 1660 for MST was provided by the first coil 150 and the coil 160 for MST described above.

The coil 1640 for NFC may include a first pattern portion 1642 connected to the input/output terminal unit 120 and rotating in one direction along the edge of the board 110, a second pattern portion 1644 connected to the first pattern portion 1642, and a third pattern portion 1646 having one end connected to the second pattern portion 1644 and the other end connected to the input/output terminal unit 120.

The first pattern portion 1642 may have one end connected to the second pattern portion 1644 and the other end connected to the input/output terminal unit 120. Further, the first pattern portion 1642 may rotate in the clockwise direction, and may form an internal area. As an example, the first pattern portion 1642 may have one, or a plurality of, turn(s).

As an example, the first pattern portion 1642 may include a 1-1-th pattern portion 1642a having one end connected to the input/output terminal unit 120 and rotating in the clockwise direction and a 1-2-th pattern portion 1642b having one end connected to the 1-1-th pattern portion 1642a and the other end connected to the second pattern portion 1644 and rotating in the clockwise direction.

Meanwhile, the first pattern portion 1642 may include a recognition force increasing portion 1642c disposed in the internal area of the first pattern portion 1642. The recognition force increasing portion 1642c may be provided in the 1-2-th pattern portion 1642b described above, and may be disposed adjacently to any one of corners of the board 110.

As an example, the recognition force increasing portion 1642 may have a stair shape.

Therefore, a magnetic field may be formed in an opposite direction (for example, a direction from a lower surface of the board toward an upper surface of the board) to that of a magnetic field formed in the surrounding area of the recognition force increasing portion 1642c in an internal area formed by the recognition force increasing portion 1642c and the 1-2-th pattern portion 1642b, resulting in an increase in recognition force of the coil 1640 for NFC.

In other words, a null area is generated at a low height from the upper surface of the board 110 up to approximately 5 mm, but the recognition force increasing portion 1642c may be formed to form a magnetic field relatively lower than that of the surrounding of the recognition force increasing portion 1642c, resulting in an increase in the recognition force at low height.

In addition, the second pattern portion 1644 may divide the internal area of the first pattern portion 1642 into two portions, and traverse the internal area of the first pattern portion 1642. In addition, the second pattern portion 1644 may include a semicircular pattern 1644a having a semicircular shape. That is, the second pattern portion 1644 may include a first linear pattern 1644b, the semicircular pattern 1644a connected to the first linear pattern 1644b, and a second linear pattern 1644c connected to the semicircular pattern 1644a.

In addition, the semicircular pattern 1644a may have the semicircular shape protruding downward of the first and second linear patterns 1644b and 1644c.

The third pattern portion 1646 may have one end connected to the second pattern portion 1644 and the other end connected to the input/output terminal unit 120, without forming one turn. A case in which the third pattern portion 1646 does not form one turn is described by way of example in the present exemplary embodiment, but the third pattern portion 1646 is not limited thereto.

As described above, an offset magnetic flux may be reduced and a wider recognition range may be obtained, through the coil 1640 for NFC.

Further, the recognition force of the coil 1640 for NFC in the surrounding area of the recognition force increasing portion 1642c may be increased through the recognition force increasing portion 1642c.

Figure 23:
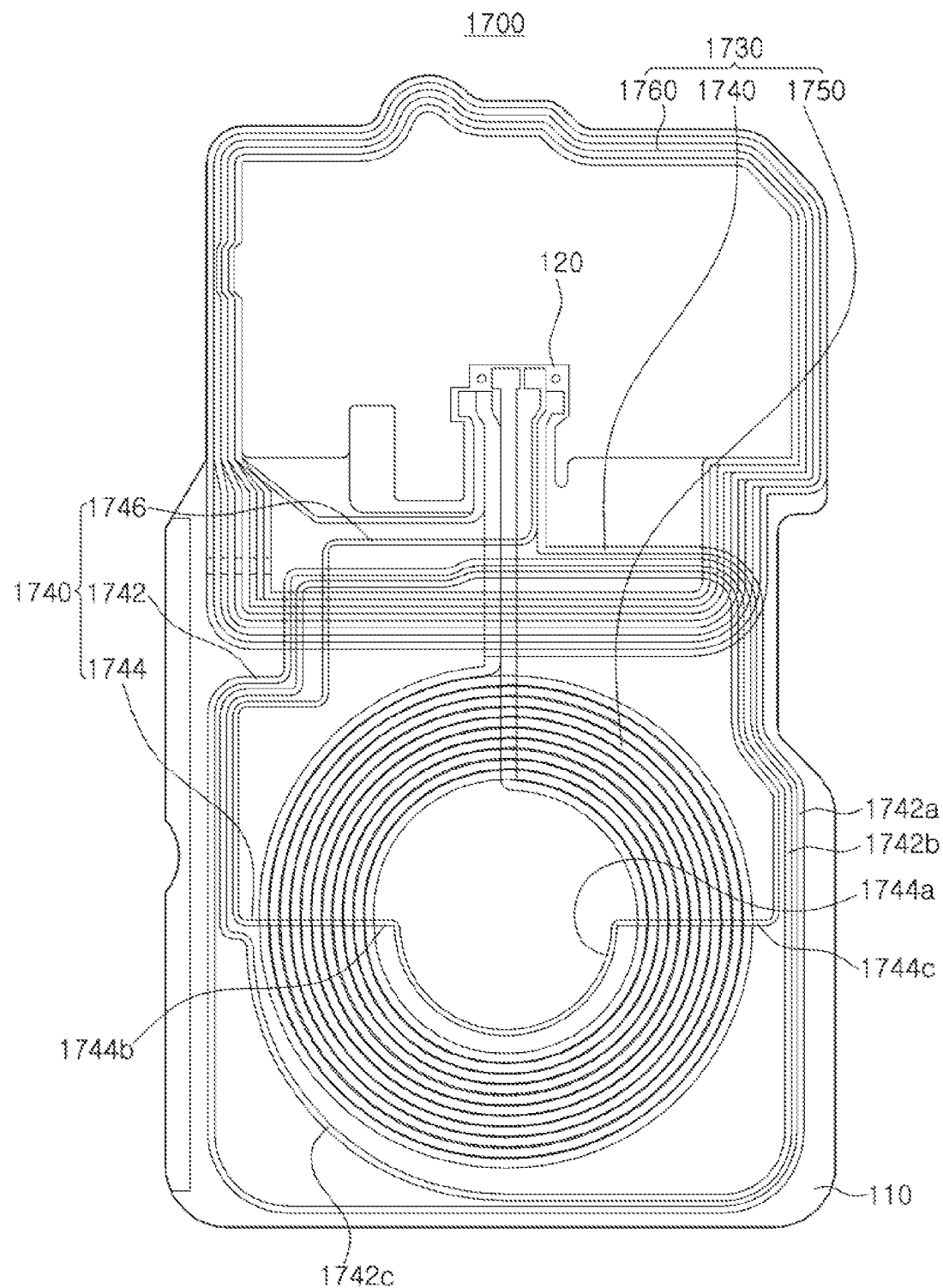
FIG. 23 is a plan view illustrating a coil module according to a fifteenth exemplary embodiment.

FIG. 23 is a plan view illustrating a coil module according to a fifteenth exemplary embodiment.

Referring to FIG. 23, a coil module 1700 according to a fifteenth exemplary embodiment may include a board 110, an input/output terminal unit 120, and a coil portion 1730.

Meanwhile, the board 110 and the input/output terminal unit 120 are different only in shapes and positions from those of the exemplary embodiment described above, and a detailed description therefor will thus be omitted.

The coil portion 1730 may be formed on a surface of the board 110, and may be connected to the input/output terminal unit 120. As an example, the coil portion 1730 may be formed of planar coils wound in the clockwise direction or in the counterclockwise direction and having a circular shape, an oval shape, or a polygonal shape.

The coil portion 1730 may include a coil 1740 for NFC disposed approximately along an edge of the board 110, a first coil 1750 disposed in a central portion of the board 110, and a coil 1760 for MST disposed above the first coil 1750.

Meanwhile, a detailed description of the first coil 1750 and the coil 1760 for MST was provided by the first coil 150 and the coil 160 for MST described above.

The coil 1740 for NFC may include a first pattern portion 1742 connected to the input/output terminal unit 120 and rotating in one direction along the edge of the board 110, a second pattern portion 1744 connected to the first pattern portion 1742, and a third pattern portion 1746 having one end connected to the second pattern portion 1744 and the other end connected to the input/output terminal unit 120.

The first pattern portion 1742 may have one end connected to the second pattern portion 1744 and the other end connected to the input/output terminal unit 120. Further, the first pattern portion 1742 may rotate in the clockwise direction, and may have an internal area. As an example, the first pattern portion 1742 may have one, or a plurality of, turn(s).

As an example, the first pattern portion 1742 may include a 1-1-th pattern portion 1742a having one end connected to the input/output terminal unit 120 and rotating in the clockwise direction and a 1-2-th pattern portion 1742b having one end connected to the 1-1-th pattern portion 1742a and the other end connected to the second pattern portion 1744 and rotating in the clockwise direction.

Meanwhile, the first pattern portion 1742 may include a recognition force increasing portion 1742c disposed in the internal area of the first pattern portion 1742. The recognition force increasing portion 1742 may be provided in the 1-2-th pattern portion 1742b described above, and may be disposed adjacently to any one of corners of the board 110.

As an example, the recognition force increasing portion 1742 may have an arc shape.

Therefore, a magnetic field may be formed in an opposite direction (for example, a direction from a lower surface of the board toward an upper surface of the board) to that of a magnetic field formed in the surrounding area of the recognition force increasing portion 1742c in an internal area formed by the recognition force increasing portion 1742 and the 1-2-th pattern portion 1742b, resulting in an increase in recognition force of the coil 1740 for NFC.

In other words, a null area is generated at a low height from the upper surface of the board 110 up to approximately 5 mm, but the recognition force increasing portion 1742c may be formed to form a magnetic field relatively lower than that of the surrounding area of the recognition force increasing portion 1742c, resulting in an increase in the recognition force at low height.

In addition, the second pattern portion 1744 may divide the internal area of the first pattern portion 1742 into two portions, and traverse the internal area of the first pattern portion 1742. In addition, the second pattern portion 1744 may include a semicircular pattern 1744a having a semicircular shape. That is, the second pattern portion 1744 may include a first linear pattern 1744b, the semicircular pattern 1744a connected to the first linear pattern 1744b, and a second linear pattern 1744c connected to the semicircular pattern 1744a.

In addition, the semicircular pattern 1744a may have the semicircular shape protruding downward of the first and second linear patterns 1744b and 1744c.

The third pattern portion 1746 may have one end connected to the second pattern portion 1744 and the other end connected to the input/output terminal unit 120, without forming one turn. A case in which the third pattern portion 1746 does not form one turn is described by way of example in the present exemplary embodiment, but the third pattern portion 1746 is not limited thereto.

As described above, an offset magnetic flux may be reduced and a wider recognition range may be obtained, through the coil 1740 for NFC.

Further, the recognition force of the coil 1740 for NFC in the surrounding area of the recognition force increasing portion 1742c may be increased through the recognition force increasing portion 1742c.

Figure 24:
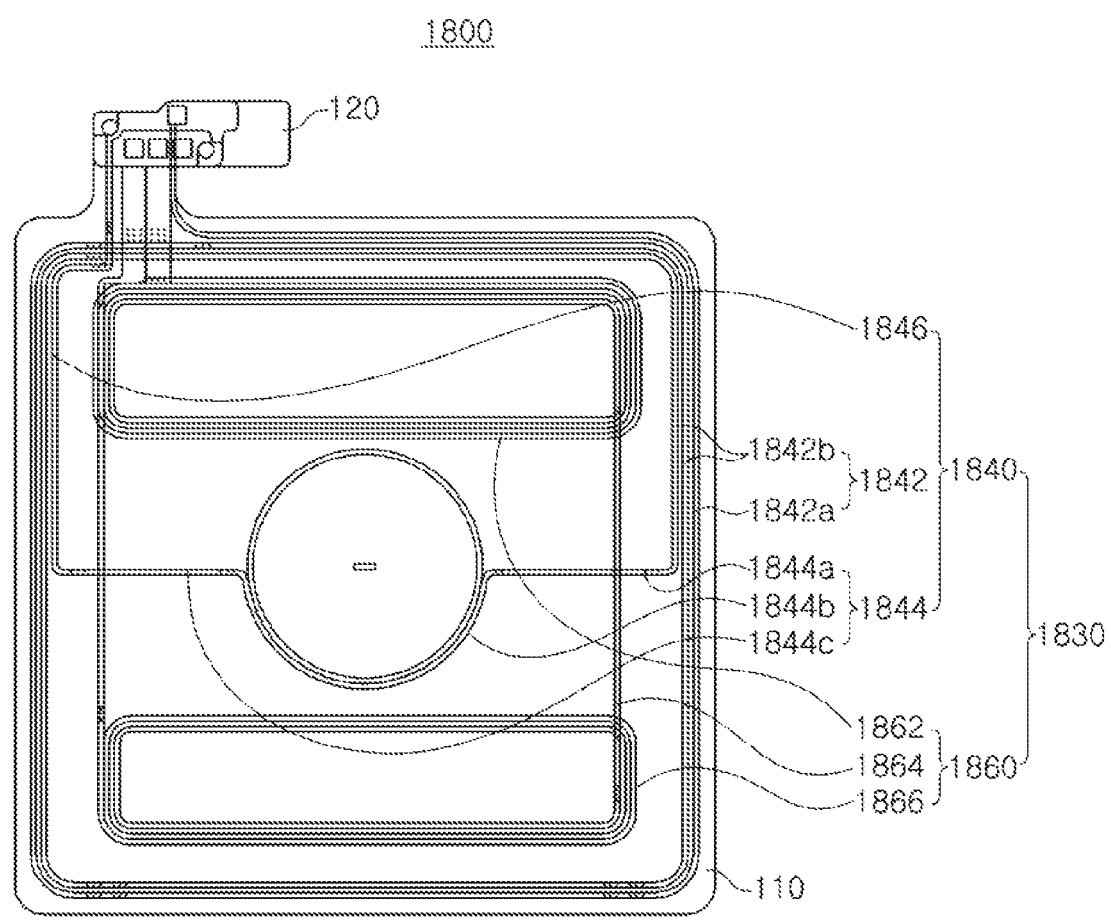
FIG. 24 is a plan view illustrating a coil module according to a sixteenth exemplary embodiment.

FIG. 24 is a plan view illustrating a coil module according to a sixteenth exemplary embodiment.

Referring to FIG. 24, a coil module 1800 according to a sixteenth exemplary embodiment may include a board 110, an input/output terminal unit 120, and a coil portion 1830.

Meanwhile, the board 110 and the input/output terminal unit 120 are different only in shapes and positions from those of the exemplary embodiment described above, and a detailed description therefor will thus be omitted.

The coil portion 1830 may be formed on one, or a plurality of, surface (s) of the board 110, and may be connected to the input/output terminal unit 120. As an example, the coil portion 1830 may be formed of planar coils wound in the clockwise direction or in the counterclockwise direction and having a circular shape, an oval shape, or a polygonal shape.

The coil portion 1830 may include a coil 1840 for NFC disposed approximately along an edge of the board 110 and a coil 1860 for MST disposed in an internal area formed by the coil 1840 for NFC.

The coil 1840 for NFC may include a first pattern portion 1842 connected to the input/output terminal unit 120 and rotating in one direction along the edge of the board 110, a second pattern portion 1844 connected to the first pattern portion 1842, and a third pattern portion 1846 having one end connected to the second pattern portion 1844 and the other end connected to the input/output terminal unit 120.

The first pattern portion 1842 may have one end connected to the second pattern portion 1844 and the other end connected to the input/output terminal unit 120. Further, the first pattern portion 1842 may rotate in the clockwise direction, and may have an internal area. As an example, the first pattern portion 1842 may have one, or a plurality of, turn(s).

As an example, the first pattern portion 1842 may include a 1-1-th pattern portion 1842*a* having one end connected to the input/output terminal unit 120 and rotating in the clockwise direction and a 1-2-th pattern portion 1842*b* having one end connected to the 1-1-th pattern portion 1842*a* and the other end connected to the second pattern portion 1844 and rotating in the clockwise direction.

In addition, the second pattern portion 1844 may divide the internal area of the first pattern portion 1842 into two portions, and traverse the internal area of the first pattern portion 1842. In addition, the second pattern portion 1844 may include a semicircular pattern 1844*a* having a semicircular shape. That is, the second pattern portion 1844 may include a first linear pattern 1844*b*, the semicircular pattern 1844*a* connected to the first linear pattern 1844*b*, and a second linear pattern 1844*c* connected to the semicircular pattern 1844*a*.

In addition, the semicircular pattern 1844*a* may have the semicircular shape protruding downward of the first and second linear patterns 1844*b* and 1844*c*.

The third pattern portion 1846 may have one end connected to the second pattern portion 1844 and the other end connected to the input/output terminal unit 120, without forming one turn. A case in which the third pattern portion 1846 does not form one turn is described by way of example in the present exemplary embodiment, but the third pattern portion 1846 is not limited thereto.

The coil 1860 for MST may be disposed in the internal area formed by the coil 1840 for NFC. As an example, the coil 1860 for MST may include a first coil portion 1862 for MST having one end connected to the input/output terminal unit 120 and disposed on an upper end portion of the board 110, a connection coil portion 1864 extended from the first coil portion 1862 for MST, and a second coil portion 1866 for MST having one end connected to the connection coil portion 1864 and the other end connected to the input/output terminal unit 120.

Meanwhile, the first coil portion 1862 for MST and the second coil portion 1866 for MST may have spiral shapes rotating in the same direction. As an example, the first coil portion 1862 for MST and the second coil portion 1866 for MST may have spiral shapes rotating in the clockwise direction.

In addition, the connection coil portion 1864 may connect the first coil portion 1862 for MST and the second coil portion 1866 for MST to each other.

Further, the second pattern portion 1844 described above may be disposed between the first coil portion 1862 for MST and the second coil portion 1866 for MST.

Figure 25:
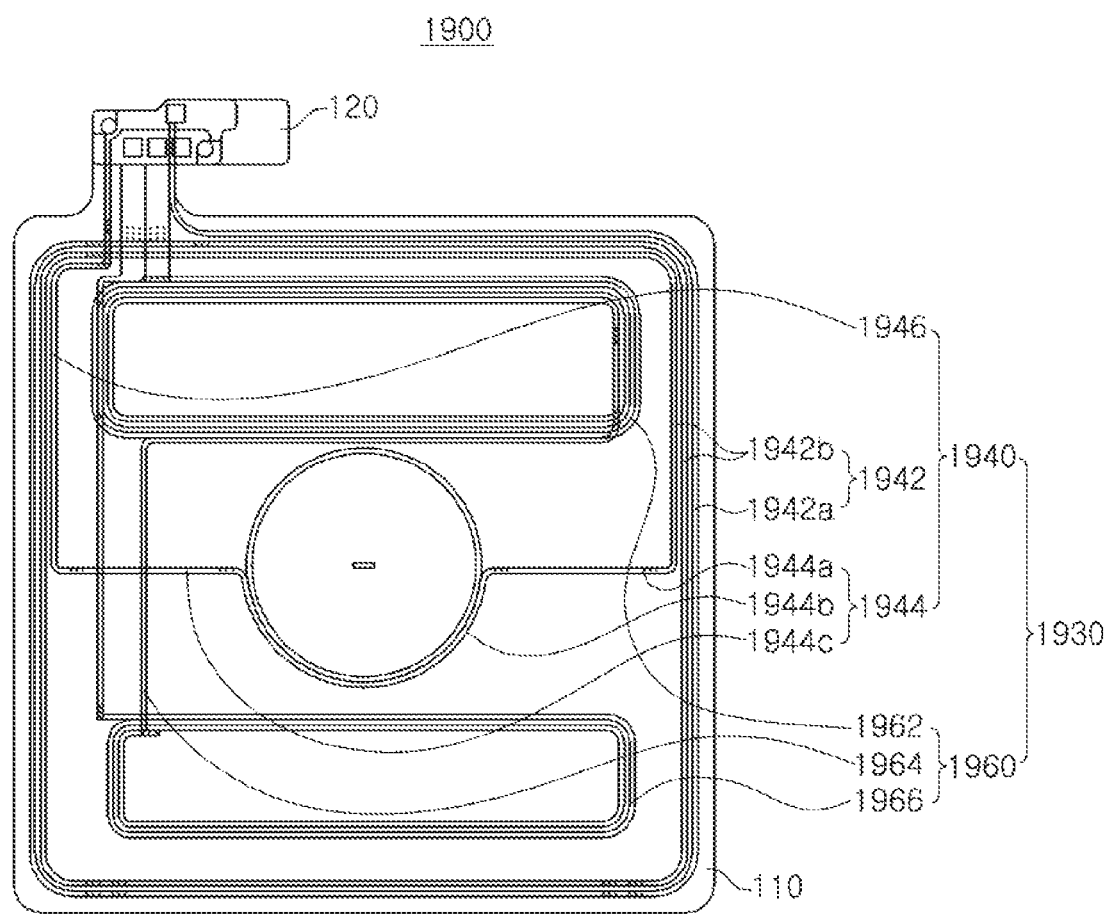
FIG. 25 is a plan view illustrating a coil module according to a seventeenth exemplary embodiment.

FIG. 25 is a plan view illustrating a coil module according to a seventeenth exemplary embodiment.

Referring to FIG. 25, a coil module 1900 according to a seventeenth exemplary embodiment may include a board 110, an input/output terminal unit 120, and a coil portion 1930.

Meanwhile, the board 110 and the input/output terminal unit 120 are different only in shapes and positions from those of the exemplary embodiment described above, and a detailed description therefor will thus be omitted.

The coil portion 1930 may be formed on a surface of the board 110, and may be connected to the input/output terminal unit 120. As an example, the coil portion 1930 may be formed of planar coils wound in the clockwise direction or in the counterclockwise direction and having a circular shape, an oval shape, or a polygonal shape.

The coil portion 1930 may include a coil 1940 for NFC disposed approximately along an edge of the board 110 and a coil 1960 for MST disposed in an internal area formed by the coil 1940 for NFC.

The coil 1940 for NFC may include a first pattern portion 1942 connected to the input/output terminal unit 120 and rotating or turning in one direction along the edge of the board 110, a second pattern portion 1944 connected to the first pattern portion 1942, and a third pattern portion 1946 having one end connected to the second pattern portion 1944 and the other end connected to the input/output terminal unit 120.

The first pattern portion 1942 may have one end connected to the second pattern portion 1944 and the other end connected to the input/output terminal unit 120. Further, the first pattern portion 1942 may rotate in the clockwise direction, and may have an internal area. As an example, the first pattern portion 1942 may have one, or a plurality of, turn(s).

As an example, the first pattern portion 1942 may include a 1-1-th pattern portion 1942*a* having one end connected to the input/output terminal unit 120 and rotating or turning in the clockwise direction and a 1-2-th pattern portion 1942*b* having one end connected to the 1-1-th pattern portion 1942*a* and the other end connected to the second pattern portion 1944 and rotating in the clockwise direction.

In addition, the second pattern portion 1944 may divide the internal area of the first pattern portion 1942 into two portions, and traverse the internal area of the first pattern portion 1942. In addition, the second pattern portion 1944 may include a semicircular pattern 1944*a* having a semicircular shape. That is, the second pattern portion 1944 may include a first linear pattern 1944*b*, the semicircular pattern 1944*a* connected to the first linear pattern 1944*b*, and a second linear pattern 1944*c* connected to the semicircular pattern 1944*a*.

In addition, the semicircular pattern 1944*a* may have the semicircular shape protruding downward of the first and second linear patterns 1944*b* and 1944*c*.

The third pattern portion 1946 may have one end connected to the second pattern portion 1944 and the other end connected to the input/output terminal unit 120, without forming one turn. A case in which the third pattern portion 1946 does not form one turn is described by way of example in the present exemplary embodiment, but the third pattern portion 1946 is not limited thereto.

The coil 1960 for MST may be disposed in the internal area formed by the coil 1940 for NFC. As an example, the coil 1960 for MST may include a first coil portion 1962 for MST having one end connected to the input/output terminal unit 120 and disposed on an upper end portion of the board 110, a connection coil portion 1964 extended from the first coil portion 1962 for MST, and a second coil portion 1966 for MST having one end connected to the connection coil portion 1964 and the other end connected to the input/output terminal unit 120.

Meanwhile, the first coil portion 1962 for MST and the second coil portion 1966 for MST may have spiral shapes rotating or turning in opposite directions. As an example, when the first coil portion 1962 for MST has a spiral shape rotating or turning in the clockwise direction, the second coil portion 1966 for MST may have a spiral shape rotating or turning in the counterclockwise direction. However, the first coil portion 1962 for MST and the second coil portion 1966 for MST are not limited thereto. That is, when the first coil portion 1962 for MST has a spiral shape rotating or turning in the counterclockwise direction, the second coil portion 1966 for MST may have a spiral shape rotating or turning in the clockwise direction.

In addition, the connection coil portion 1964 may connect the first coil portion 1962 for MST and the second coil portion 1966 for MST to each other.

Further, the second pattern portion 1944 described above may be disposed between the first coil portion 1962 for MST and the second coil portion 1966 for MST.

As set forth above, according to the exemplary embodiments in the present disclosure, the recognition rate of the tags may be improved, and NFC performance may be improved.

While exemplary embodiments have been shown and described above, it will be apparent to those skilled in the art that modifications and variations could be made without departing from the scope of the present invention as defined by the appended claims.

What is claimed is:
1. A coil module comprising:
a board;
an input/output terminal unit on the board; and
a coil on a surface of the board and connected to the input/output terminal unit,
wherein the coil includes a first pattern portion having one end connected to the input/output terminal unit and being on the board to define an internal area surrounded by the first pattern portion, a second pattern portion connected to the first pattern portion and traversing the internal area from one end to another end to divide the internal area into two or more portions, and a third pattern portion having one end connected to the second pattern portion and the other end connected to the input/output terminal unit,
the second pattern portion is in the internal area surrounded by the first pattern portion, and
a number of lines of the second pattern portion is smaller than or equal to a number of turns of the first pattern portion.
2. The coil module of claim 1, wherein the second pattern portion includes a semicircular pattern in a central portion thereof.

3. The coil module of claim 1, wherein the first pattern portion includes a 1-1-th pattern portion connected to the input/output terminal unit and along an edge of the board and a 1-2-th pattern portion connected to the 1-1-th pattern portion and inside the 1-1-th pattern portion.
4. The coil module of claim 3, wherein the third pattern portion is on the board and is partially inside the 1-2-th pattern portion.
5. The coil module of claim 1, wherein the first pattern portion is along an edge of the board, the second pattern portion has a semicircular pattern in the internal area, and the third pattern portion has one end portion connected to the second pattern portion inside the first pattern portion and another end portion outside the first pattern portion and connected to the input/output terminal unit.
6. The coil module of claim 1, wherein the second pattern portion includes an inclined pattern inclined in relation to one side surface of the board.
7. The coil module of claim 6, wherein the inclined pattern has a first inclined pattern having a first gradient with respect to the side surface of the board and a second inclined pattern having a second gradient with respect to the side surface of the board, the first gradient being different from the second gradient.
8. The coil module of claim 7, wherein the second inclined pattern has the second gradient with a sign opposite to the first gradient.
9. The coil module of claim 1, further comprising:
a shielding sheet on an upper surface of the board; and
a protective film on the shielding sheet.
10. The coil module of claim 1, wherein at least one of the first pattern portion and the third pattern portion has a recognition force increasing portion in the internal area.
11. The coil module of claim 10, wherein the internal area is divided into a lower internal area and an upper internal area, the recognition force increasing portion is in the lower internal area, rotates in one direction or in another direction, and has a ring shape.
12. The coil module of claim 10, wherein the first pattern portion has a 1-1-th pattern portion connected to the input/output terminal unit and along an edge of the board, and a 1-2-th pattern portion connected to the 1-1-th pattern portion and inside the 1-1-th pattern portion, and the recognition force increasing portion is in the 1-2-th pattern portion and is adjacent to one of corners of the board.
13. The coil module of claim 10, wherein the recognition force increasing portion has a stair shape or an arc shape.
14. The coil module for claim 1, wherein the coil is for near field communications (NFC).
15. The coil module of claim 1, wherein the first pattern portion is configured to turn in one direction.
16. A coil module comprising:
a flexible board;
an input/output terminal unit extended from the flexible board;
a first coil on a surface of the flexible board and connected to the input/output terminal unit; and
a second coil on the surface of the flexible board,
wherein the first coil includes a first pattern portion having one end connected to the input/output terminal unit and being on the board to define an internal area surrounded by the first pattern portion, a second pattern portion connected to the first pattern portion and traversing the internal area from one end to another end to divide the internal area into two or more portions, and a third pattern portion having one end connected to the second pattern portion and the other end connected to the input/output terminal unit, and wherein the second coil includes a third coil having a planar spiral shape and fourth coil spaced apart from the first coil and having the planar spiral shape, one, or both, of the third coil and the fourth coil is or are in the internal area, the second pattern portion is in the internal area surrounded by the first pattern portion, and a first number of lines of the second pattern portion is smaller than or equal to a number of turns of the first pattern portion.

17. The coil module of claim 16, wherein in an area in which the second coil and the first coil overlap each other, one of second coil or the first coil is on an upper surface of the flexible board, and the other of the first coil and the second coil penetrates through the flexible board and is on a lower surface of the flexible board.

18. The coil module of claim 16, wherein the first pattern portion is along an edge of the flexible board.

19. The coil module of claim 18, wherein the second pattern portion is a single strand of wire.

20. The coil module of claim 18, wherein the second pattern portion traverses the internal area in a transversal direction.

21. The coil module of claim 20, wherein the second pattern portion traverses a central portion of the internal area.

22. The coil module of claim 16, wherein the third pattern portion has one end portion connected to the second pattern portion inside the first pattern portion and the other end portion outside the first pattern portion and connected to the input/output terminal unit.

23. The coil module of claim 16, wherein the first coil is for near field communications (NFC) and the second coil is for magnetic secure transmission (MST).

24. The coil module of claim 16, wherein the third coil and the fourth coil are for MST.

25. The coil module of claim 16, wherein the first coil is configured to turn in one direction.

* * * * *